US012489100B2

(12) United States Patent
Ham et al.

(10) Patent No.: US 12,489,100 B2
(45) Date of Patent: Dec. 2, 2025

(54) DISPLAY PANEL AND DISPLAY DEVICE INCLUDING THE SAME

(71) Applicant: LG Display Co., Ltd., Seoul (KR)

(72) Inventors: Sujin Ham, Seoul (KR); Aesun Kim, Seoul (KR)

(73) Assignee: LG Display Co., Ltd., Seoul (KR)

(*) Notice: Subject to any disclaimer, the term of this patent is extended or adjusted under 35 U.S.C. 154(b) by 687 days.

(21) Appl. No.: 17/901,267

(22) Filed: Sep. 1, 2022

(65) Prior Publication Data

US 2023/0197700 A1     Jun. 22, 2023

(30) Foreign Application Priority Data

Dec. 21, 2021   (KR) .................. 10-2021-0184334

(51) Int. Cl.
*H01L 25/16*      (2023.01)
*H10D 86/40*      (2025.01)
(Continued)

(52) U.S. Cl.
CPC ......... *H01L 25/167* (2013.01); *H10D 86/443* (2025.01); *H10D 86/60* (2025.01); *H01L 24/05* (2013.01); *H01L 24/27* (2013.01); *H01L 24/29* (2013.01); *H01L 24/32* (2013.01); *H01L 24/83* (2013.01); *H01L 2224/05567* (2013.01); *H01L 2224/05573* (2013.01);
(Continued)

(58) Field of Classification Search
None
See application file for complete search history.

(56) References Cited

U.S. PATENT DOCUMENTS

| 9,760,241 B1 | 9/2017 | Lewbel |
| 10,224,495 B2 | 3/2019 | Sasaki |

(Continued)

FOREIGN PATENT DOCUMENTS

| CN | 111243442 A | 6/2020 |
| JP | 2013174738 A | 9/2013 |

(Continued)

OTHER PUBLICATIONS

Alexander et al., "Tilt Displays: Designing Display Surfaces with Multi-Axis Tilting and Actuation," Proceedings of the 2012 ACM Conference on Computer and Communications Security, Raleigh, North Carolina, Oct. 16-18, 2012, DOI: 10.1145/2371574.2371600, published Sep. 2012, 10 pages.

*Primary Examiner* — William C Trapanese
(74) *Attorney, Agent, or Firm* — Seed Intellecutal Property Law Group LLP

(57) ABSTRACT

A display device according to an example embodiment of the present disclosure includes a stretchable display panel; and an actuator configured to deform the display panel, wherein the display panel includes a first area that is protruded by the actuator, a second area that is not protruded by the actuator, and a third area that is between the first area and the second area, wherein a plurality of pixels are disposed in the first area and the second area, wherein in the third area, only a plurality of connection lines connecting the plurality of pixels disposed in the first area and the plurality of pixels disposed in the second area are disposed, so that three-dimensional display capability of the display device can be improved.

34 Claims, 25 Drawing Sheets

(51) Int. Cl.
  *H10D 86/60* (2025.01)
  *H01L 23/00* (2006.01)
  *H10H 20/825* (2025.01)
  *H10H 20/857* (2025.01)

(52) U.S. Cl.
  CPC ................ *H01L 2224/2731* (2013.01); *H01L 2224/29028* (2013.01); *H01L 2224/32147* (2013.01); *H01L 2224/83201* (2013.01); *H01L 2224/83851* (2013.01); *H10H 20/825* (2025.01); *H10H 20/857* (2025.01)

(56) References Cited

U.S. PATENT DOCUMENTS

| | | |
|---|---|---|
| 11,322,565 B2 | 5/2022 | Jeon et al. |
| 2013/0249975 A1 | 9/2013 | Davie et al. |
| 2017/0068318 A1 | 3/2017 | McClure et al. |
| 2017/0329148 A1 | 11/2017 | Huang et al. |
| 2019/0228685 A1 | 7/2019 | Yu et al. |
| 2021/0043700 A1 | 2/2021 | Park et al. |
| 2021/0183962 A1 | 6/2021 | Kim et al. |
| 2021/0191552 A1* | 6/2021 | Bok ........................ H10K 59/38 |
| 2022/0149140 A1* | 5/2022 | Bang .................... H10D 86/423 |
| 2022/0165720 A1* | 5/2022 | Eom ...................... H01L 25/167 |
| 2022/0335899 A1* | 10/2022 | Park ...................... G09G 3/3291 |
| 2023/0147678 A1* | 5/2023 | Wu ........................ G06F 3/0412 |
| | | 345/174 |
| 2023/0157146 A1 | 5/2023 | Han |

FOREIGN PATENT DOCUMENTS

| | | |
|---|---|---|
| JP | 2013196000 A | 9/2013 |
| JP | 2017191138 A | 10/2017 |
| JP | 2018504012 A | 2/2018 |
| JP | 2020106832 A | 7/2020 |
| KR | 20170087732 A | 7/2017 |

\* cited by examiner

DISPLAY PANEL AND DISPLAY DEVICE INCLUDING THE SAME

CROSS-REFERENCE TO RELATED APPLICATIONS

This application claims the benefit of and priority to Korean Patent Application No. 10-2021-0184334 filed on Dec. 21, 2021 in the Republic of Korea, the entire contents of which are hereby expressly incorporated by reference into the present application.

BACKGROUND

Technical Field

The present disclosure relates to a display device, and more particularly, to a stretchable display device.

Description of the Related Art

Display devices used for a computer monitor, a TV, a mobile phone, and the like include an organic light emitting display (OLED) that emits light by itself, a liquid-crystal display (LCD) that requires a separate light source, and the like.

Such display devices are being applied to more and more various fields including not only a computer monitor and a TV, but personal mobile devices, and thus, display devices having a reduced volume and weight while having a wide active area are being studied.

Recently, a display device manufactured to be stretchable in a specific direction and changeable into various shapes by forming a display unit, lines, and the like on a flexible substrate such as plastic that is a flexible material has received considerable attention as a next-generation display device.

BRIEF SUMMARY

An aspect of the present disclosure is to provide a display panel having an improved capability of realizing a three-dimensional display and a display device including the same.

Another aspect of the present disclosure is to provide a display panel capable of outputting a high-resolution image and a display device including the same.

Still another aspect of the present disclosure is to provide a display panel capable of securing stretch reliability and a display device including the same.

Objects of the present disclosure are not limited to the above-mentioned objects, and other objects, which are not mentioned above, can be clearly understood by those skilled in the art from the following descriptions.

A display device according to an example embodiment of the present disclosure includes a stretchable display panel; and an actuator configured to deform the display panel, wherein the display panel includes a first area that is protruded by the actuator, a second area that is not protruded by the actuator, and a third area that is between the first area and the second area, wherein a plurality of pixels are disposed in the first area and the second area, wherein in the third area, only a plurality of connection lines connecting the plurality of pixels disposed in the first area and the plurality of pixels disposed in the second area are disposed, so that three-dimensional display capability of the display device can be improved.

A display panel according to another example embodiment of the present disclosure is divided into a first area, a third area disposed outside the first area, and a second area disposed outside the third area, and the display panel includes a lower stretched substrate; rigid patterns disposed on the lower stretched substrate and including a plurality of plate patterns and a plurality of line patterns; a plurality of pixels disposed on each of the plurality of plate patterns; a plurality of connection lines disposed on each of the plurality of line patterns; and an upper stretched substrate covering the plurality of pixels and the plurality of connection lines, wherein a plurality of pixels and a plurality of connection lines are disposed in the first area and the second area, wherein in the third area, only a plurality of connection lines are disposed, so that a three-dimensional display can be realized.

Other matters of the example embodiments are included in the detailed description and the drawings.

According to the present disclosure, an actuator can effectively deform a display panel, so that three-dimensional display realization capability of a display device can be improved.

According to the present disclosure, stretching stress can be effectively relieved, thereby improving stretching reliability of a display device.

According to the present disclosure, it is possible to output a high-resolution image in an area with a low stretching frequency, thereby realizing a display device of higher quality.

The effects according to the present disclosure are not limited to the contents exemplified above, and more various effects are included in the present specification.

DETAILED DESCRIPTION

Figure 1:
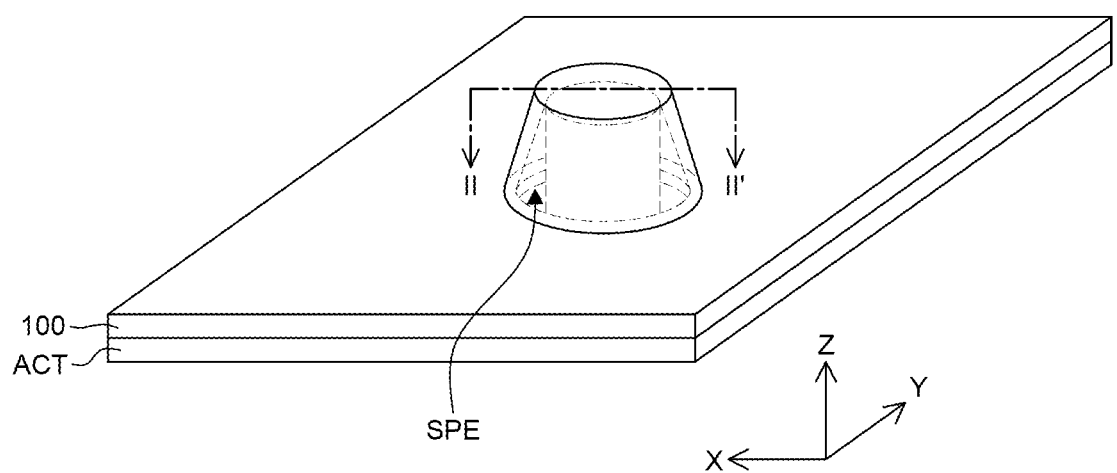
FIG. 1 is a perspective view of a display device according to an example embodiment of the present disclosure.

Advantages and characteristics of the present disclosure and a method of achieving the advantages and characteristics will be clear by referring to example embodiments described below in detail together with the accompanying drawings. However, the present disclosure is not limited to the example embodiments disclosed herein but will be implemented in various forms. The example embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the example embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Display Panel and Actuator

FIG. 1 is a perspective view of a display device according to an example embodiment of the present disclosure.

Figure 2A:
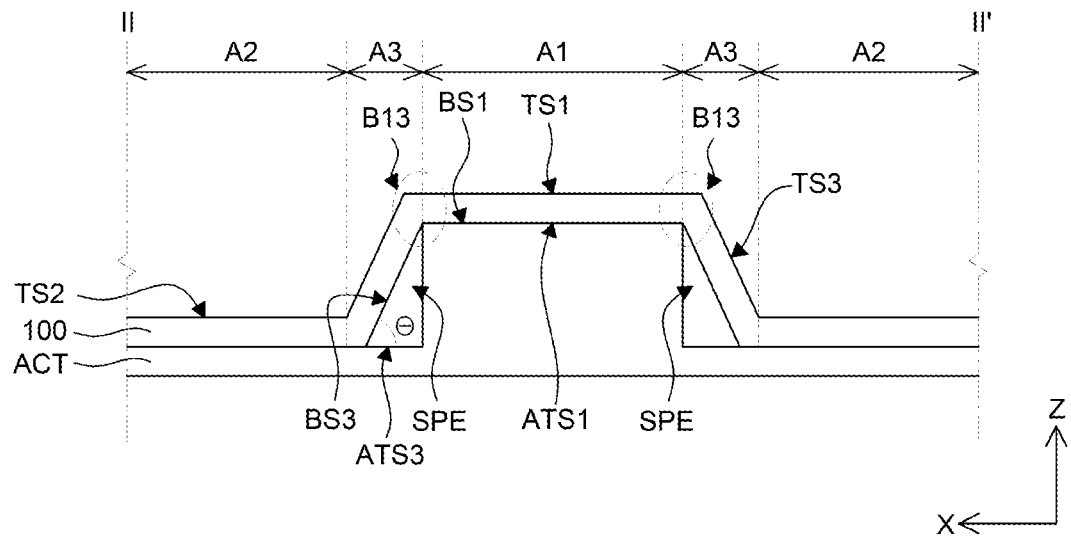
FIGS. 2A and 2B are cross-sectional views taken along cutting line II-II' shown in FIG. 1.
Figure 2B:
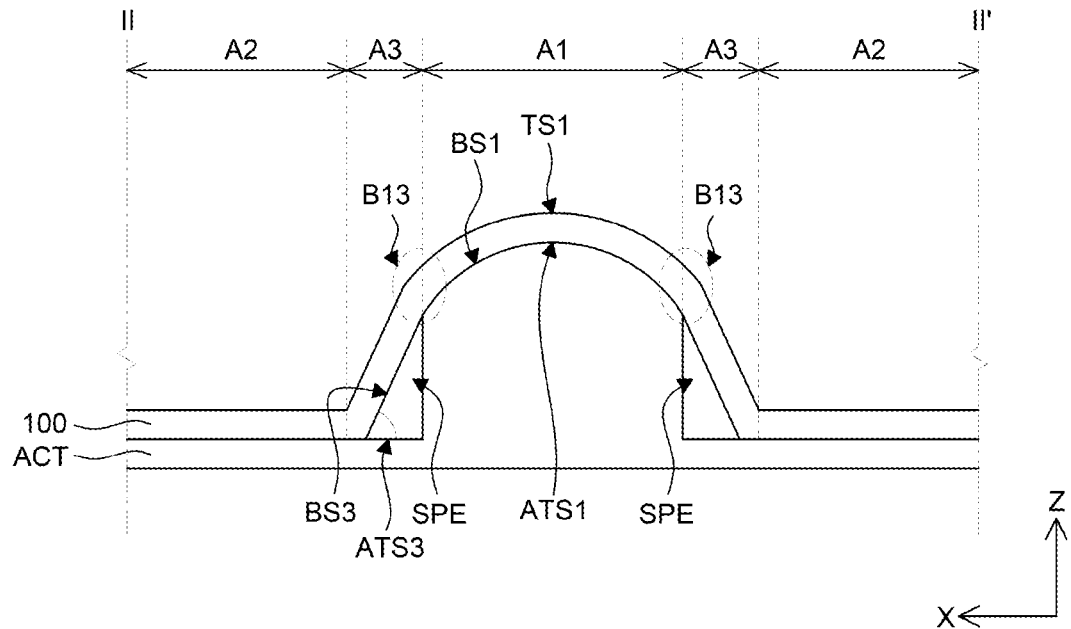

FIGS. 2A and 2B are cross-sectional views taken along cutting line II-II' shown in FIG. 1.

FIG. 2A illustrates a case in which a contact portion between a display panel and an actuator has a flat surface, and FIG. 2B illustrates a case in which a contact portion between the display panel and the actuator has a spherical surface.

The display device according to an example embodiment of the present disclosure includes a stretchable display panel and an actuator ACT configured to change the panel into various shapes.

In one embodiment, the actuator ACT deforms the shape of a display panel 100. Specifically, the actuator ACT may allow a partial area of the actuator ACT to be protruded in a direction of the display panel 100, so that a partial area of the display panel 100 may be protruded. For example, as shown in FIG. 1, the actuator ACT may allow a partial area of the actuator ACT to be protruded in a Z-direction, and deform the partial area of the display panel 100 corresponding to the partial area of the actuator ACT into a convex shape in which it is protruded in the Z-direction.

Here, the actuator ACT may be configured of an electroactive polymer (EAP), a piezoelectric element, a shape memory alloy (SMA), a thermofluidic pocket, a micro-electro-mechanical system (MEMS) element, a MEMS pump, a resonant device or the like. The electroactive polymer can deform its shape in response to an application of voltage. The electroactive polymer may be configured of at least one of electrostrictive polymers (EP), dielectric elastomers (DE), conducting polymers, ionic polymer metal composites (IPMC), responsive gels, and bucky gels.

Also, the shape memory alloy (SMA) that recovers its original shape according to ambient temperature and/or surrounding environments when the original shape is deformed, may be composed of a copper-zinc-aluminum, copper-aluminum-nickel, nickel-titanium alloy or a combination of copper-zinc-aluminum, copper-aluminum-nickel, and/or nickel-titanium alloys.

In addition, the display panel 100 may be stretched by the actuator ACT. Specifically, the display panel of the display device according to an example embodiment of the present disclosure is a display element capable of displaying an image even when stretched, bent, or extended by the actuator ACT, and may also be referred to as a stretchable display panel, a flexible display panel, and an extendable display panel. Also, when the actuator ACT is restored to its original flat state, the display panel may also be restored to a flat state. In this case, the protruded portion of the display panel 100 caused by the actuator ACT as shown in FIG. 1 would instead have a flat surface. In other words, a top surface TS1 of the display panel 100 in a first area A1, a top surface TS2 of the display panel 100 in a second area A2, and a top surface TS3 of the display panel 100 in a third area A3 may have a coplanar top surface with each other (see FIG. 2A).

As illustrated in FIGS. 2A and 2B, when the display panel 100 is deformed by the actuator ACT, it can be divided into three areas. That is, the display panel 100 may be divided into a first area A1 that is protruded by the actuator ACT, a second area A2 that is not protruded by the actuator ACT, and a third area A3 between and connected to the first area A1 and the second area A2.

Specifically, as shown in FIG. 2A, the first area A1 is in direct contact with a partial area of the actuator ACT that is protruded in a third direction (i.e., Z-axis direction), and may have a flat shape in which it extends in a first direction X and a second direction Y. In addition, the second area A2 is in direct contact with another area of the actuator ACT that is not protruded, and may have a flat shape in which it extends in the first direction X and the second direction Y. Accordingly, the first area A1 and the second area A2 may be disposed on different planes. Here, the top surface TS1 of the display panel 100 is at an elevated position with respect to the top surface TS2 of the display panel 100 due to the protrusion. Since the third area A3 is between and coupled to the first area A1 and the second area A2 disposed on different planes, the third area A3 may be inclined with respect to the planes of the first direction X and the second direction Y (for example, an inclination angle θ between a top surface ATS3 of the actuator ACT in the third area A3 and a bottom surface BS3 of the display panel 100 in the third area A3). In addition, the third area A3 does not directly contact the actuator ACT and thus, is not directly deformed by the actuator ACT. However, the third area A3 may be indirectly deformed by the first area A1 and the second area A2. As shown in FIGS. 1, 2A, and 2B, in the third area A3, there is a space SPE between the actuator ACT and the display panel 100. This is the gap or the hollow space SPE caused by actuator ACT. Accordingly, the top surface ATS3 of the actuator ACT in the third area A3 and the bottom surface BS3 of the display panel 100 in the third area A3 are spaced apart from each other.

However, the present disclosure is not limited thereto, and as illustrated in FIG. 2B, the first area A1 may be in direct contact with a partial area of the actuator ACT protruded in the third direction Z and may have a spherical shape. That is, a bottom surface BS1 of the display panel 100 in the first area A1 may directly contact with a top surface ATS1 of the actuator ACT in the first area A1. Unlike the embodiment shown in FIG. 2A, the actuator ACT does not have a flat top surface in the embodiment shown in FIG. 2B. As shown in FIG. 2B, the actuator ACT causes the top surface ATS1 of the actuator ACT in the first area A1 to protrude in the z-axis direction where the top surface ATS1 has a curved shape rather than a flat shape. Accordingly, at a boundary B13 between the first area A1 and the third area A3, the display panel 100 may not be deformed in an angular shape but may be deformed in a curved shape. One of the technical benefits of having this features is that it reduces a stress applied to the display panel 100 at the boundary B13 between the first area A1 and the third area A3.

Display Panel

Figure 3:
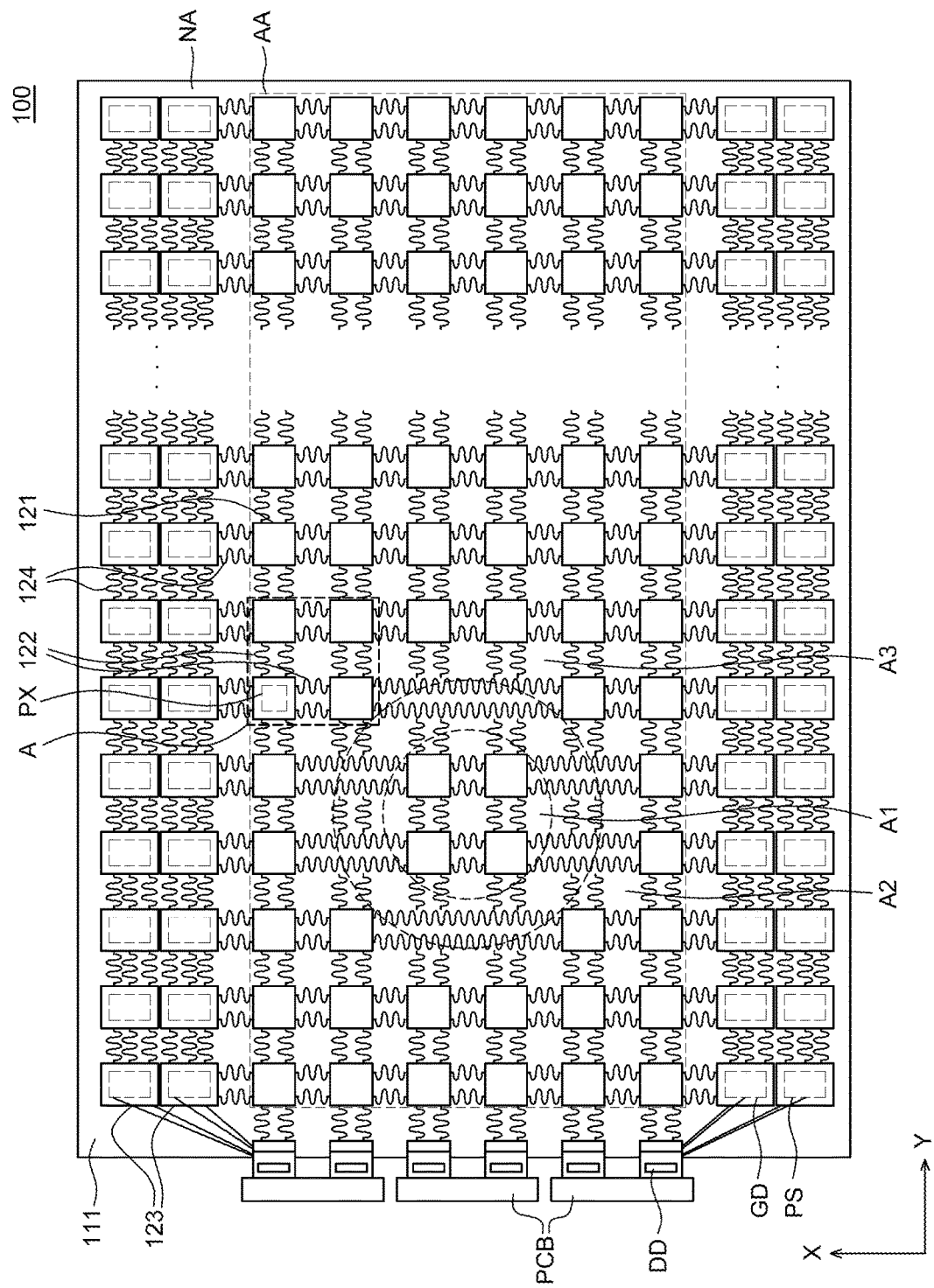
FIG. 3 is a plan view of a display panel of a display device according to an example embodiment of the present disclosure.

FIG. 3 is a plan view of a display panel of a display device according to an example embodiment of the present disclosure.

Figure 4:
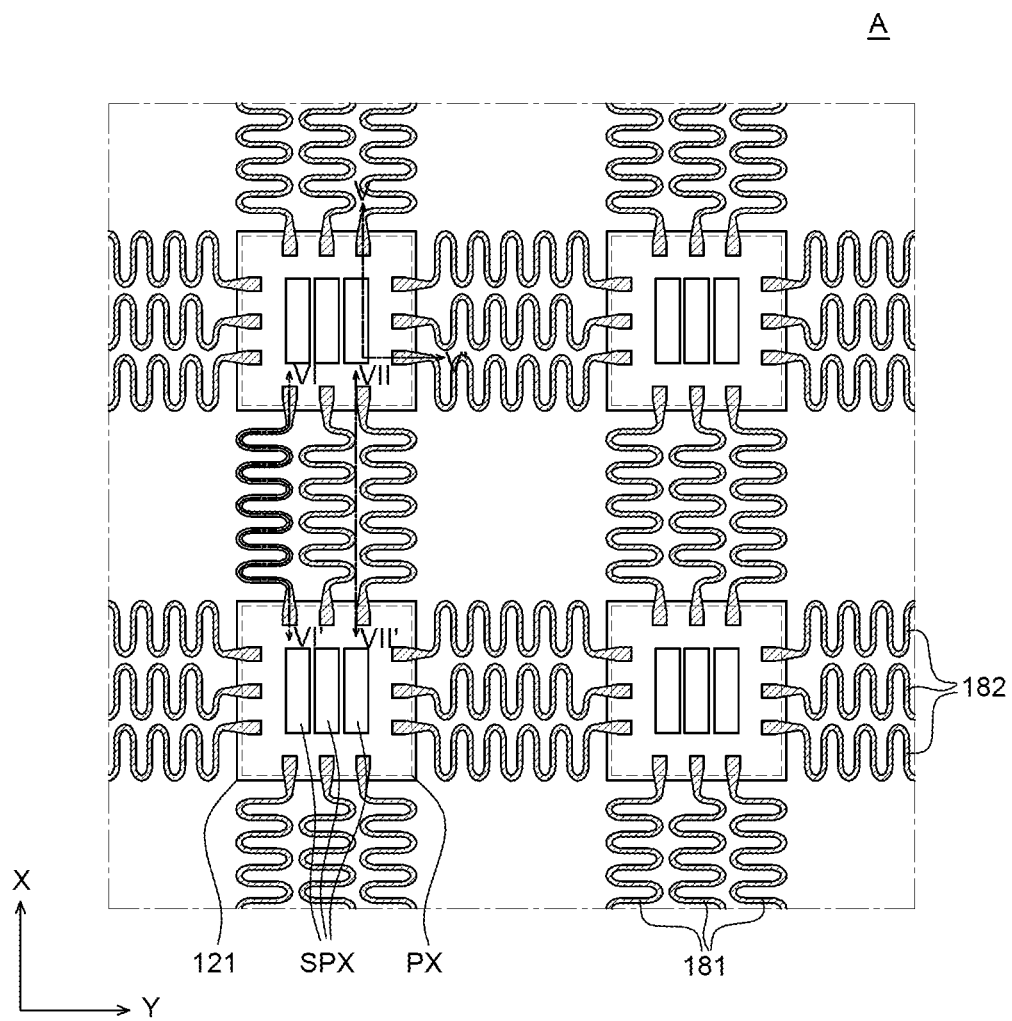
FIG. 4 is an enlarged plan view of an active area of the display device according to an example embodiment of the present disclosure.

FIG. 4 is an enlarged plan view of an active area of the display device according to an example embodiment of the present disclosure.

Figure 5:
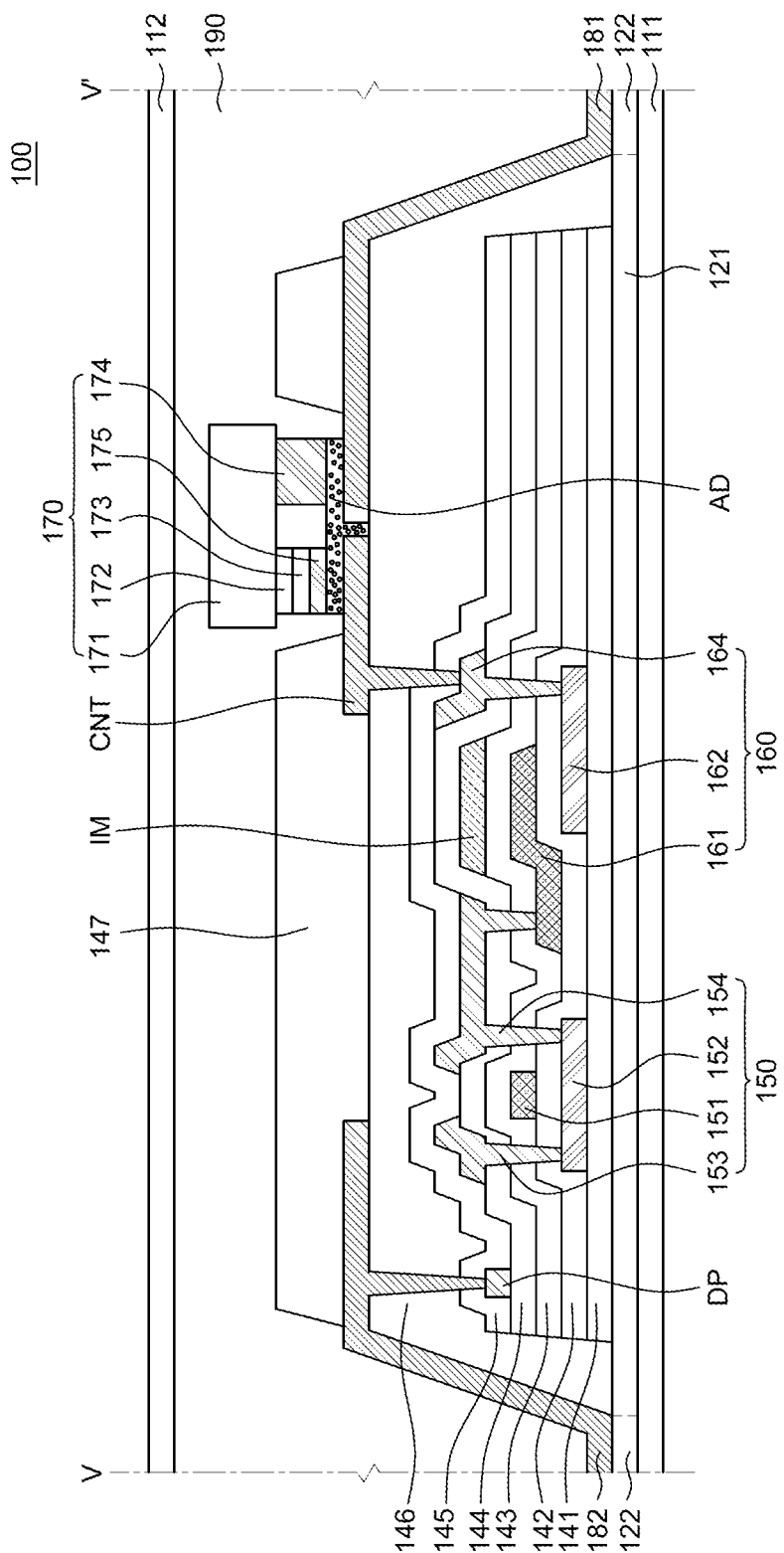
FIG. 5 is a cross-sectional view taken along cutting line V-V' shown in FIG. 4.

FIG. 5 is a cross-sectional view taken along cutting line V-V' shown in FIG. 4.

Specifically, FIG. 4 is an enlarged plan view of area A shown in FIG. 3.

Referring to FIG. 3, the display panel 100 of the display device according to an example embodiment of the present disclosure may include a lower substrate 111, a pattern layer 120, a plurality of pixels PX, gate drivers GD, data drivers DD, and power supplies PS. And, referring to FIG. 5, the display panel 100 of the display device according to an example embodiment of the present disclosure may further include a filling layer 190 and an upper substrate 112.

The lower substrate 111 is a substrate for supporting and protecting various components of the display panel 100 of the display device. In addition, the upper substrate 112 is a substrate for covering and protecting various components of the display panel 100 of the display device. That is, the lower substrate 111 is a substrate that supports the pattern layer 120 on which the pixels PX, the gate drivers GD, and the power supplies PS are formed. In addition, the upper substrate 112 is a substrate that covers the pixels PX, the gate drivers GD, and the power supplies PS.

Each of the lower substrate 111 and the upper substrate 112 is a ductile substrate and may be formed of an insulating material that can be bent or stretched. For example, each of the lower substrate 111 and the upper substrate 112 may be formed of silicone rubber such as polydimethylsiloxane (PDMS) or elastomers such as polyurethane (PU) and polytetrafluoroethylene (PTFE), and thus, may have flexible properties. In addition, materials of the lower substrate 111 and the upper substrate 112 may be the same, but are not limited thereto and may be variously modified.

Each of the lower substrate 111 and the upper substrate 112 is a ductile substrate and may be reversibly expandable and contractible. Accordingly, the lower substrate 111 may be referred to as a lower stretchable substrate, a lower flexible substrate, a lower extendable substrate, a lower ductile substrate, a first stretchable substrate, a first flexible substrate, a first extendable substrate, or a first ductile substrate, and the upper substrate 112 may be referred to as an upper stretchable substrate, an upper flexible substrate, an upper extendable substrate, an upper ductile substrate, a second stretchable substrate, a second flexible substrate, a second extendable substrate, or a second ductile substrate. Further, moduli of elasticity of the lower substrate 111 and the upper substrate 112 may be several MPa to several hundreds of MPa. Further, a ductile breaking rate of the lower substrate 111 and the upper substrate 112 may be 100% or higher. Here, the ductile breaking rate refers to a stretching rate at a time when an object to be stretched is broken or cracked. A thickness of the lower substrate may be 10 μm to 1 mm, but is not limited thereto.

The lower substrate 111 may have an active area AA and a non-active area NA surrounding the active area AA. However, the active area AA and the non-active area NA are not limited to the lower substrate 111 and may be referred throughout the display panel.

The active area AA is an area in which an image is displayed on the display panel 100 of the display device. The plurality of pixels PX are disposed in the active area AA. In addition, each of the pixels PX may include a display element and various driving elements for driving the display element. The various driving elements may mean at least one thin film transistor TFT and a capacitor, but are not limited thereto. In addition, each of the plurality of pixels PX may be connected to various lines. For example, each of the plurality of pixels PX may be connected to various lines such as gate lines, data lines, high potential power lines, low potential power lines, or reference voltage lines.

The non-active area NA is an area in which an image is not displayed. The non-active area NA may be disposed adjacent to the active area AA. For example, the non-active area NA may be an area surrounding the active area AA. However, the present disclosure is not limited thereto, and the non-active area NA corresponds to an area of the lower substrate 111 excluding the active area AA and may be changed and separated into various shapes. Components for driving the plurality of pixels PX disposed in the active area AA are disposed in the non-active area NA. The gate drivers GD and power supplies PS may be disposed in the non-active area NA. In addition, a plurality of pads that are connected to the gate drivers GD and the data drivers DD may be disposed in the non-active area NA, and each of the pads may be connected to each of the plurality of pixels PX in the active area AA.

Referring to FIG. 3, the first area A1 that is protruded by the actuator ACT mentioned in FIGS. 1 and 2 may be disposed in the active area AA, and the second area A2 that is not protruded by the actuator ACT may be disposed over the active area AA and the non-active area NA. Accordingly, the third area A3 connecting the first area A1 and the second area A2 may be disposed in the active area AA. Also, as shown in FIG. 3, the plurality of pixels PX may be disposed only in the first area A1 and the second area A2, and the plurality of pixels PX are not disposed in the third area A3.

On the lower substrate 111, the pattern layer 120 including a plurality of first plate patterns 121 and a plurality of first line patterns 122 that are disposed in the active area AA and a plurality of second plate patterns 123 and a plurality of second line patterns 124 that are disposed in the non-active area NA is disposed.

The plurality of first plate patterns 121 may be disposed in the active area AA of the lower substrate 111. In addition, the plurality of pixels PX may be formed on the plurality of first plate patterns 121. In addition, the plurality of second plate patterns 123 may be disposed in the non-active area NA of the lower substrate 111. In addition, the gate drivers GD and the power supplies PS may be formed on the plurality of second plate patterns 123.

The plurality of first plate patterns 121 and the plurality of second plate patterns 123 as described above may be disposed in the form of islands that are spaced apart from each other. Each of the plurality of first plate patterns 121 and the plurality of second plate patterns 123 may be individually separated. Accordingly, the plurality of first plate patterns 121 and the plurality of second plate patterns 123 may be referred to as first island patterns and second island patterns, or first individual patterns and second individual patterns.

Specifically, the gate drivers GD may be mounted on the plurality of second plate patterns 123. The gate driver GD may be formed on the second plate pattern 123 in a gate in panel (GIP) method when various components on the first plate pattern 121 are manufactured. Accordingly, various circuit components constituting the gate drivers GD such as various transistors, capacitors, and lines may be disposed on the plurality of second plate patterns 123. However, the present disclosure is not limited thereto, and the gate driver GD may be mounted in a chip on film (COF) method.

In addition, the power supplies PS may be mounted on the plurality of second plate patterns 123. The power supply PS may be formed on the second plate pattern 123 with a plurality of power blocks that are patterned when various components on the first plate pattern 121 are manufactured. Accordingly, the power blocks disposed on different layers may be disposed on the second plate pattern 123. That is, a lower power block and an upper power block may be sequentially disposed on the second plate pattern 123. In addition, a low potential voltage may be applied to the lower power block, and a high potential voltage may be applied to the upper power block. Accordingly, the low potential voltage may be supplied to the plurality of pixels PX through the lower power block. In addition, the high potential voltage may be supplied to the plurality of pixels PX through the upper power block.

Referring to FIG. 3, sizes of the plurality of second plate patterns 123 may be greater than sizes of the plurality of first plate patterns 121. Specifically, the size of each of the plurality of second plate patterns 123 may be greater than the size of each of the plurality of first plate patterns 121. As described above, the gate driver GD may be disposed on each of the plurality of second plate patterns 123, and one stage of the gate driver GD may be disposed on each of the plurality of second plate patterns 123. Accordingly, since an area that is occupied by various circuit components constituting one stage of the gate driver GD is relatively greater than an area occupied by the pixels PX, the size of each of the plurality of second plate patterns 123 may be greater than the size of each of the first plate patterns 121.

In FIG. 3, the plurality of second plate patterns 123 are illustrated as being disposed on both sides in the first direction X in the non-active area NA, but the present disclosure is not limited thereto, and the plurality of second plate patterns 123 may be disposed in any region of the non-active area NA. In addition, although the plurality of first plate patterns 121 and the plurality of second plate patterns 123 are shown in a quadrangular shape, the present disclosure is not limited thereto, and the plurality of first plate patterns 121 and the plurality of second plate patterns 123 are changeable in various forms.

Referring to FIGS. 3 and 5, the pattern layer 120 may further include the plurality of first line patterns 122 disposed in the active area AA and the plurality of second line patterns 124 disposed in the non-active area NA.

The plurality of first line patterns 122 are patterns that are disposed in the active area AA and connect the first plate patterns 121 adjacent to each other, and may be referred to as first connection patterns. That is, the plurality of first line patterns 122 are disposed between the plurality of first plate patterns 121.

The plurality of second line patterns 124 may be patterns that are disposed in the non-active area NA and connect the first plate patterns 121 and the second plate patterns 123 adjacent to each other or the plurality of second plate patterns 123 adjacent to each other. Accordingly, the plurality of second line patterns 124 may be referred to as second connection patterns. That is, the plurality of second line patterns 124 may be disposed between the first plate patterns 121 and the second plate patterns 123 that are adjacent to each other. In addition, the plurality of second line patterns 124 may be disposed between the plurality of second plate patterns 123 adjacent to each other.

Referring to FIG. 3, the plurality of first line patterns 122 and the plurality of second line patterns 124 have a curved shape. For example, the plurality of first line patterns 122 and the plurality of second line patterns 124 may have a sine wave shape. However, the shapes of the plurality of first line patterns 122 and the plurality of second line patterns 124 are not limited thereto. For example, the plurality of first line patterns 122 and the plurality of second line patterns 124 may extend in a zigzag manner. Alternatively, the plurality of first line patterns 122 and the plurality of the second line patterns 124 may have various shapes, such as shapes in which a plurality of rhombus-shaped substrates are extended by being connected at vertices thereof. The numbers and shapes of the plurality of first line patterns 122 and the second line patterns 124 illustrated in FIG. 3 are example, and the numbers and shapes of the plurality of first line patterns 122 and the second line patterns 124 may be variously changed according to design.

In addition, the plurality of first plate patterns 121, the plurality of first line patterns 122, the plurality of second plate patterns 123, and the plurality of second line patterns 124 are rigid patterns. That is, the plurality of first plate patterns 121, the plurality of first line patterns 122, the plurality of second plate patterns 123, and the plurality of second line patterns 124 may be rigid than the lower substrate 111 and the upper substrate 112. Accordingly, moduli of elasticity of the plurality of first plate patterns 121, the plurality of first line patterns 122, the plurality of second plate patterns 123, and the plurality of second line patterns 124 may be higher than a modulus of elasticity of the lower substrate 111. The modulus of elasticity is a parameter representing a rate of deformation against a stress applied to the substrate. When the modulus of elasticity is relatively high, hardness may be relatively high. Accordingly, the plurality of first plate patterns 121, the plurality of first line patterns 122, the plurality of second plate patterns 123, and the plurality of second line patterns 124 may be referred to as a plurality of first rigid patterns, a plurality of second rigid patterns, a plurality of third rigid patterns, and a plurality of fourth rigid patterns, respectively. The moduli of elasticity of the plurality of first plate patterns 121, the plurality of first line patterns 122, the plurality of second plate patterns 123, and the plurality of second line patterns 124 may be 1000 times higher than the moduli of elasticity of the lower substrate 111 and the upper substrate 112, but the present disclosure is not limited thereto.

The plurality of first plate patterns 121, the plurality of first line patterns 122, the plurality of second plate patterns 123, and the plurality of second line patterns 124 that are a plurality of rigid substrates may be formed of a plastic material having flexibility that is lower than that of the lower substrate 111 and the upper substrate 112. For example, the plurality of first plate patterns 121, the plurality of first line patterns 122, the plurality of second plate patterns 123, and the plurality of second line patterns 124 may be formed of at least one material among polyimide (PI), polyacrylate, and polyacetate. In this case, the plurality of first plate patterns 121, the plurality of first line patterns 122, the plurality of second plate patterns 123, and the plurality of second line patterns 124 may be formed of the same material, but they are not limited thereto and may be formed of different materials. When the plurality of first plate patterns 121, the plurality of first line patterns 122, the plurality of second plate patterns 123, and the plurality of second line patterns 124 are formed of the same material, they may be integrally formed.

In some embodiments, the lower substrate 111 may be defined as including a plurality of first lower patterns and a second lower pattern. The plurality of first lower patterns may be areas of the lower substrate 111 that overlap the plurality of first plate patterns 121 and the plurality of second plate patterns 123. The second lower pattern may be an area that does not overlap the plurality of first plate patterns 121 and the plurality of second plate patterns 123.

Also, the upper substrate 112 may be defined as including a plurality of first upper patterns and a second upper pattern. The plurality of first upper patterns may be areas of the upper substrate 112 that overlap the plurality of first plate patterns 121 and the plurality of second plate patterns 123. The second upper pattern may be an area that does not overlap the plurality of first plate patterns 121 and the plurality of second plate patterns 123.

In this case, moduli of elasticity of the plurality of first lower patterns and first upper patterns may be greater than moduli of elasticity of the second lower patterns and the second upper patterns. For example, the plurality of first lower patterns and the first upper patterns may be formed of the same material as the plurality of first plate patterns 121 and the plurality of second plate patterns 123, and the second lower pattern and the second upper pattern may be formed of a material having a modulus of elasticity lower than those of the plurality of first plate patterns 121 and the plurality of second plate patterns 123.

That is, the first lower pattern and the first upper pattern may be formed of polyimide (PI), polyacrylate, polyacetate, or the like and the second lower pattern and the second upper pattern may be formed of silicon rubber such as polydimethylsiloxane (PDMS) or an elastomer such as polyurethane (PU) or polytetrafluoroethylene (PTFE).

Non-Active Area Driving Element

The gate drivers GD are components which supply a gate voltage to the plurality of pixels PX disposed in the active area AA. The gate drivers GD include a plurality of stages formed on the plurality of second plate patterns 123 and respective stages of the gate drivers GD may be electrically connected to each other through a plurality of gate connection lines. Accordingly, a gate voltage output from any one of stages may be transmitted to another stage. Further, the respective stages may sequentially supply the gate voltage to the plurality of pixels PX connected to the respective stages.

The power supplies PS may be connected to the gate drivers GD and supply a gate driving voltage and a gate clock voltage. Further, the power supplies PS may be connected to the plurality of pixels PX and supply a pixel driving voltage to each of the plurality of pixels PX. The power supplies PS may also be formed on the plurality of second plate patterns 123. That is, the power supplies PS may be formed on the plurality of second plate patterns 123 to be adjacent to the gate drivers GD. Further, each of the power supplies PS formed on the plurality of second plate patterns 123 may be electrically connected to the gate driver GD and the plurality of pixels PX. That is, the plurality of power supplies PS formed on the plurality of second plate patterns 123 may be connected by a gate power supply connection line and a pixel power supply connection line. Therefore, each of the plurality of power supplies PS may supply a gate driving voltage, a gate clock voltage, and a pixel driving voltage.

The printed circuit board PCB is a component which transmits signals and voltages for driving the display element from a control unit to the display element. Therefore, the printed circuit board PCB may also be referred to as a driving substrate. A control unit such as an IC chip or a circuit may be mounted on the printed circuit board PCB.

Further, a memory, a processor or the like may be mounted on the printed circuit board PCB. Further, the printed circuit board PCB provided in the display panel 100 of the display device may include a stretchable area and a non-stretchable area to secure stretchcapability. Also, on the non-stretchable area, an IC chip, a circuit, a memory, a processor and the like may be mounted, and in the stretchable area, lines electrically connected to the IC chip, the circuit, the memory and the processor may be disposed.

The data driver DD is a component which supplies a data voltage to the plurality of pixels PX disposed in the active area AA. The data driver DD may be configured in a form of an IC chip and thus, may also be referred to as a data integrated circuit D-IC. Further, the data driver DD may be mounted on the non-stretchable area of the printed circuit board PCB. That is, the data driver DD may be mounted on the printed circuit board PCB in a form of a chip on board (COB). Although in FIG. 3, it is illustrated that the data driver DD is mounted in a chip on board (COB) manner, the present disclosure is not limited thereto and the data driver DD may be mounted in a chip on film (COF), a chip on glass (COG), a tape carrier package (TCP) manner, or the like.

Also, although it is illustrated in FIG. 3 that one data driver DD is disposed to correspond to a line of the first plate patterns 121 disposed in the active area AA, the present disclosure is not limited thereto. That is, one data driver DD may be disposed to correspond to a plurality of columns of the first plate patterns 121.

Figure 6:
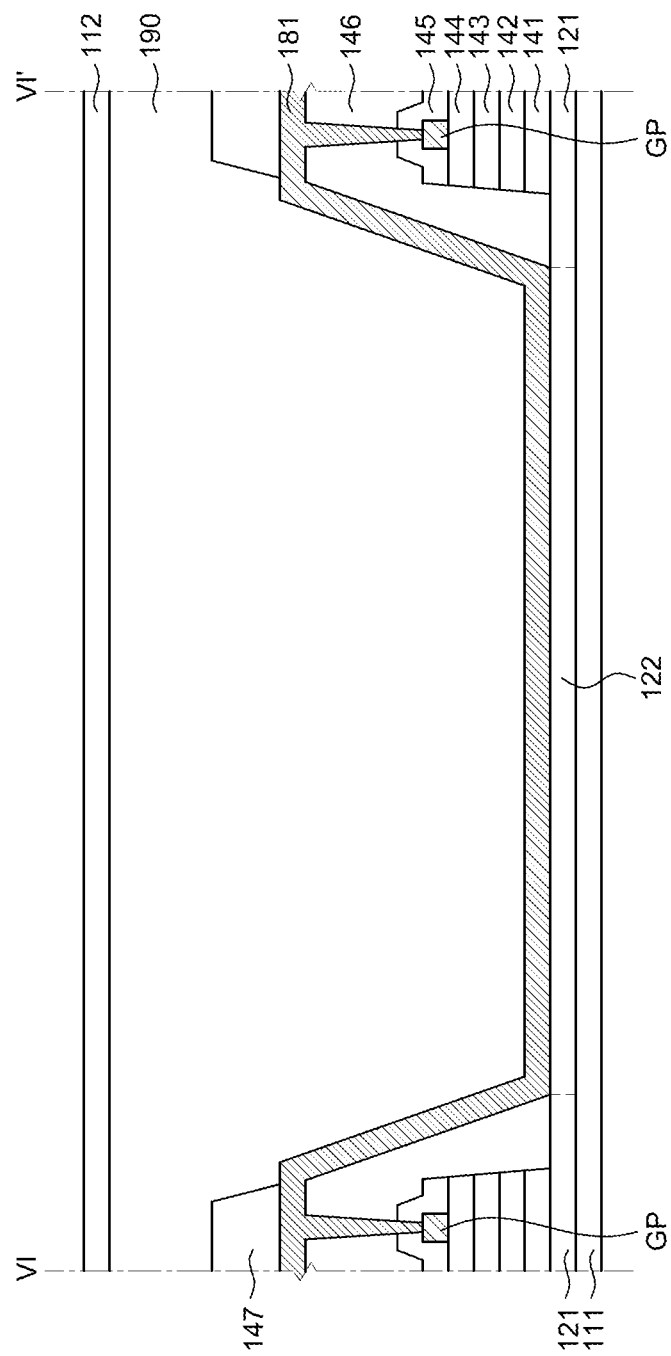
FIG. 6 is a cross-sectional view taken along cutting line VI-VI' shown in FIG. 4.
Figure 7:
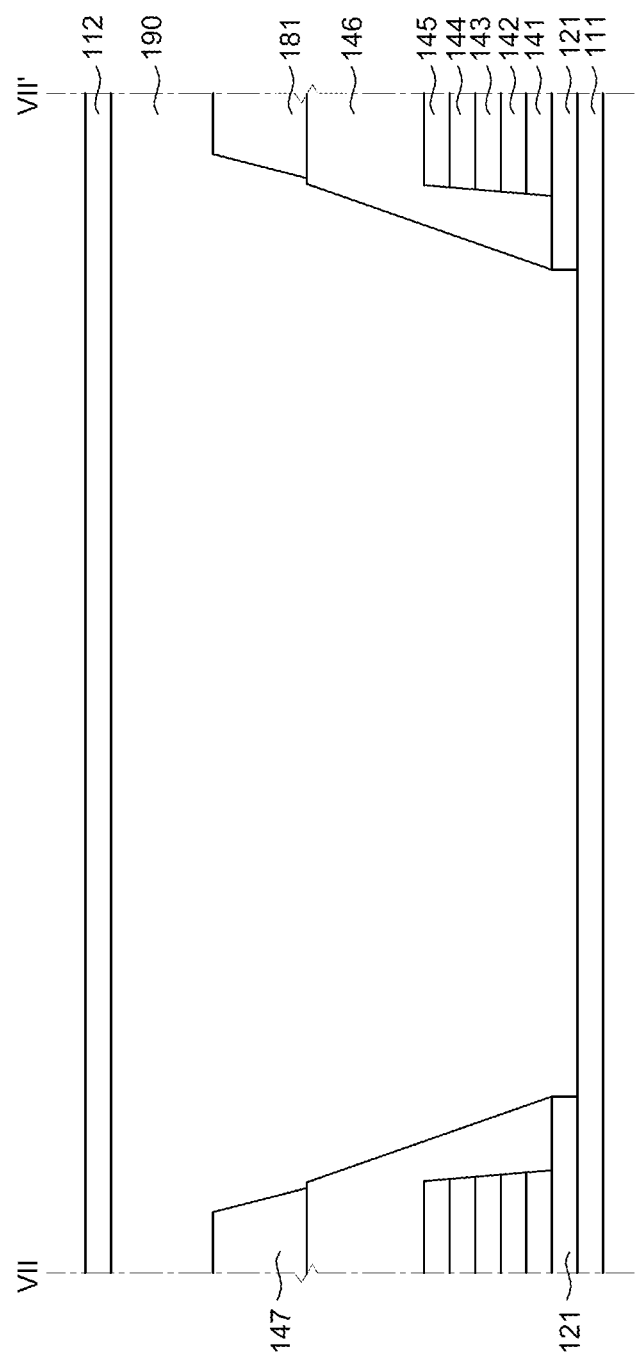
FIG. 7 is a cross-sectional view taken along cutting line VII-VII' shown in FIG. 4.

Hereinafter, FIGS. 6 and 7 are referred together for a more detailed description of the active area AA of the display panel 100 of the display device according to an example embodiment of the present disclosure.

Planar and Cross-Sectional Structures of Active Area

FIG. 6 is a cross-sectional view taken along cutting line VI-VI' shown in FIG. 4.

FIG. 7 is a cross-sectional view taken along cutting line VII-VII' shown in FIG. 4.

FIGS. 3 to 5 are referred together for convenience of description.

Referring to FIG. 3 and FIG. 4, the plurality of first plate patterns 121 are disposed on the lower substrate 111 in the active area AA. The plurality of first plate patterns 121 are disposed to be spaced apart from each other on the lower substrate 111. For example, the plurality of first plate patterns 121 may be disposed in a matrix form on the lower substrate 111 as shown in FIG. 3, but are not limited thereto.

Referring to FIG. 4 and FIG. 5, a pixel PX including a plurality of sub-pixels SPX is disposed on the first plate pattern 121. Also, each of the sub-pixels SPX may include an LED 170, which is a display element and a driving transistor 160 and a switching transistor 150 for driving the LED 170. However, the display element in the sub-pixel SPX is not limited to the LED and may be an organic light emitting diode. Further, the plurality of sub-pixels SPX may include a red sub-pixel, a green sub-pixel, and a blue sub-pixel, but are not limited thereto. Colors of the plurality of sub-pixels SPX may be variously changed as needed.

The plurality of sub-pixels SPX may be connected to a plurality of connection lines 181 and 182. That is, the plurality of sub-pixels SPX may be electrically connected to the first connection lines 181 extended in the first direction X. Also, the plurality of sub-pixels SPX may be electrically connected to the second connection lines 182 extended in the second direction Y.

Hereinafter, a cross-sectional structure of the active area AA will be described in detail with reference to FIG. 5.

Referring to FIG. 5, a plurality of inorganic insulating layers are disposed on the plurality of first plate patterns 121. For example, the plurality of inorganic insulating layers may include a buffer layer 141, a gate insulating layer 142, a first interlayer insulating layer 143, a second interlayer insulating layer 144, and a passivation layer 145. However, the present disclosure is not limited thereto. Various inorganic insulating layers may be further disposed on the plurality of first plate patterns 121. One or more of the buffer layer 141, the gate insulating layer 142, the first interlayer insulating layer 143, the second interlayer insulating layer 144, and the passivation layer 145 which are inorganic insulating layers may be omitted.

Specifically, the buffer layer 141 is disposed on the plurality of first plate patterns 121. The buffer layer 141 is formed on the plurality of first plate patterns 121 to protect various components of the display panel 100 of the display device against permeation of moisture ($H_2O$), oxygen ($O_2$) or the like from the outside of the lower substrate 111 and the plurality of first plate patterns 121. The buffer layer 141 may be formed of an insulating material. For example, the buffer layer 141 may be formed as a single layer or multiple layers of silicon nitride (SiNx), silicon oxide (SiOx), silicon oxynitride (SiON), or the like. However, the buffer layer 141 may be omitted depending on a structure or characteristics of the display panel 100 of the display device.

In this case, the buffer layer 141 may be formed only in an area where the buffer layer 141 overlaps the plurality of first plate patterns 121 and the plurality of second plate patterns 123. As described above, the buffer layer 141 may be formed of an inorganic material. Thus, the buffer layer 141 may be easily damaged, such as easily cracked, while the display panel 100 of the display device is stretched. Therefore, the buffer layer 141 may not be formed in areas between the plurality of first plate patterns 121 and the plurality of second plate patterns 123. The buffer layer 141 may be patterned into shapes of the plurality of first plate patterns 121 and the plurality of second plate patterns 123 and formed only on upper portions of the plurality of first plate patterns 121 and the plurality of second plate patterns 123. Accordingly, in the display panel 100 of the display device according to an example embodiment of the present disclosure, the buffer layer 141 is formed only in the area where the buffer layer 141 overlaps the plurality of first plate patterns 121 and the plurality of second plate patterns 123 which are rigid substrates, so that damage to various components of the display panel 100 of the display device may be prevented even when the display panel 100 of the display device is deformed, such as bent or stretched.

Referring to FIG. 5, the switching transistor 150 including a gate electrode 151, an active layer 152, a source electrode 153 and a drain electrode 154, and the driving transistor 160 including a gate electrode 161, an active layer 162, a source electrode and a drain electrode 164 are formed on the buffer layer 141.

First, referring to FIG. 5, the active layer 152 of the switching transistor 150 and the active layer 162 of the driving transistor 160 are disposed on the buffer layer 141. For example, each of the active layer 152 of the switching transistor 150 and the active layer 162 of the driving transistor 160 may be formed of an oxide semiconductor. Alternatively, the active layer 152 of the switching transistor 150 and the active layer 162 of the driving transistor 160 may be formed of amorphous silicon (a-Si), polycrystalline silicon (poly-Si), an organic semiconductor or the like.

The gate insulating layer 142 is disposed on the active layer 152 of the switching transistor 150 and the active layer 162 of the driving transistor 160. The gate insulating layer 142 is configured to electrically insulate the gate electrode 151 of the switching transistor 150 from the active layer 152 of the switching transistor 150 and electrically insulate the gate electrode 161 of the driving transistor 160 from the active layer 162 of the driving transistor 160. Further, the gate insulating layer 142 may be formed of an insulating material. For example, the gate insulating layer 142 may be formed as a single layer of silicon nitride (SiNx) or silicon oxide (SiOx) or multiple layers of silicon nitride (SiNx) or silicon oxide (SiOx), but is not limited thereto.

The gate electrode 151 of the switching transistor 150 and the gate electrode 161 of the driving transistor 160 are disposed on the gate insulating layer 142. The gate electrode 151 of the switching transistor 150 and the gate electrode 161 of the driving transistor 160 are disposed to be spaced apart from each other on the gate insulating layer 142. Further, the gate electrode 151 of the switching transistor 150 overlaps the active layer 152 of the switching transistor 150, and the gate electrode 161 of the driving transistor 160 overlaps the active layer 162 of the driving transistor 160.

Each of the gate electrode 151 of the switching transistor 150 and the gate electrode 161 of the driving transistor 160 may be formed of any one of various metal materials, for example, any one of molybdenum (Mo), aluminum (Al), chromium (Cr), gold (Au), titanium (Ti), nickel (Ni), neodymium (Nd) and copper (Cu). Alternatively, each of the gate electrode 151 of the switching transistor 150 and the gate electrode 161 of the driving transistor 160 may be formed of an alloy of two or more of them, or a plurality of layer thereof, but is not limited thereto.

The first interlayer insulating layer 143 is disposed on the gate electrode 151 of the switching transistor 150 and the gate electrode 161 of the driving transistor 160. The first interlayer insulating layer 143 insulates the gate electrode 161 of the driving transistor 160 from an intermediate metal layer IM. The first interlayer insulating layer 143 may also be formed of an inorganic material like the buffer layer 141. For example, the first interlayer insulating layer 143 may be formed as a single layer of silicon nitride (SiNx) or silicon oxide (SiOx) or multiple layers of silicon nitride (SiNx) or silicon oxide (SiOx), but is not limited thereto.

The intermediate metal layer IM is disposed on the first interlayer insulating layer 143. Further, the intermediate metal layer IM overlaps the gate electrode 161 of the driving transistor 160. Thus, a storage capacitor is formed in an area where the intermediate metal layer IM overlaps the gate electrode 161 of the driving transistor 160. Specifically, the gate electrode 161 of the driving transistor 160, the first interlayer insulating layer 143 and the intermediate metal layer IM form the storage capacitor. However, a position of the intermediate metal layer IM is not limited thereto. The intermediate metal layer IM may overlap another electrode to form a storage capacitor in various ways.

The intermediate metal layer IM may be formed of any one of various metal materials, for example, any one of molybdenum (Mo), aluminum (Al), chromium (Cr), gold (Au), titanium (Ti), nickel (Ni), neodymium (Nd) and copper (Cu). Alternatively, the intermediate metal layer IM may be formed of an alloy of two or more of them, or a plurality of layer thereof, but is not limited thereto.

The second interlayer insulating layer 144 is disposed on the intermediate metal layer IM. The second interlayer insulating layer 144 insulates the gate electrode 151 of the switching transistor 150 from the source electrode 153 and the drain electrode 154 of the switching transistor 150. Also, the second interlayer insulating layer 144 insulates the intermediate metal layer IM from the source electrode and the drain electrode 164 of the driving transistor 160. The second interlayer insulating layer 144 may also be formed of an inorganic material like the buffer layer 141. For example, the first interlayer insulating layer 143 may be formed as a single layer of silicon nitride (SiNx) or silicon oxide (SiOx) or multiple layers of silicon nitride (SiNx) or silicon oxide (SiOx), but is not limited thereto.

The source electrode 153 and the drain electrode 154 of the switching transistor 150 are disposed on the second interlayer insulating layer 144. Also, the source electrode and the drain electrode 164 of the driving transistor 160 are disposed on the second interlayer insulating layer 144. The source electrode 153 and the drain electrode 154 of the switching transistor 150 are disposed to be spaced apart from each other on the same layer. Further, although FIG. 5 does not illustrate the source electrode of the driving transistor 160, the source electrode and the drain electrode 164 of the driving transistor 160 are also disposed to be spaced apart from each other on the same layer. In the switching transistor 150, the source electrode 153 and the drain electrode 154 may be electrically connected to the active layer 152 to be in contact with the active layer 152. Also, in the driving transistor 160, the source electrode and the drain electrode 164 may be electrically connected to the active layer 162 to be in contact with the active layer 162. Further, the drain electrode 154 of the switching transistor 150 may be electrically connected to the gate electrode 161 of the driving transistor 160 to be in contact with the gate electrode 161 of the driving transistor 160 through a contact hole.

The source electrode 153 and the drain electrodes 154 and 164 may be formed of any one of various metal materials, for example, any one of molybdenum (Mo), aluminum (Al), chromium (Cr), gold (Au), titanium (Ti), nickel (Ni), neodymium (Nd) and copper (Cu). Alternatively, the source electrode 153 and the drain electrodes 154 and 164 may be formed of an alloy of two or more of them, or a plurality of layer thereof, but are not limited thereto.

Further, in the present disclosure, the driving transistor 160 has been described as having a coplanar structure, but various types of transistors having a staggered structure or the like may also be used. Also, in the present specification, the transistor may be formed not only IN a top gate structure but also in a bottom gate structure.

A gate pad GP and a data pad DP may be disposed on the second interlayer insulating layer 144.

Specifically, referring to FIG. 6, the gate pad GP serves to transfer a gate voltage to the plurality of sub-pixels SPX. The gate pad GP is connected to the first connection line 181 through a contact hole. In addition, the gate voltage supplied from the first connection line 181 may be transferred from the gate pad GP to the gate electrode 151 of the switching transistor 150 through a line formed on the first plate pattern 121.

In addition, the data pad DP serves to transfer a data voltage to the plurality of sub-pixels SPX. The data pad DP is connected to the second connection line 182 through a contact hole. In addition, the data voltage supplied from the second connection line 182 may be transferred from the data pad DP to the source electrode 153 of the switching transistor 150 through a line formed on the first plate pattern 121.

The gate pad GP and the data pad DP may be formed of the same material as the source electrode 153 and the drain electrodes 154 and 164, but are not limited thereto.

Referring to FIG. 5, the passivation layer 145 is formed on the switching transistor 150 and the driving transistor 160. The passivation layer 145 covers the switching transistor 150 and the driving transistor 160 to protect the switching transistor 150 and the driving transistor 160 against permeation of moisture, oxygen, and the like. The passivation layer 145 may be formed of an inorganic material and formed as a single layer or a plurality of layers, but is not limited thereto.

Also, the gate insulating layer 142, the first interlayer insulating layer 143, the second interlayer insulating layer 144 and the passivation layer 145 may be patterned and formed only in an area where they overlap the plurality of first plate patterns 121. The gate insulating layer 142, the first interlayer insulating layer 143, the second interlayer insulating layer 144 and the passivation layer 145 may also be formed of an inorganic material like the buffer layer 141. Thus, the gate insulating layer 142, the first interlayer insulating layer 143, the second interlayer insulating layer 144 and the passivation layer 145 may be easily damaged, such as easily cracked, while the display panel 100 of the display device is stretched. Therefore, the gate insulating layer 142, the first interlayer insulating layer 143, the second interlayer insulating layer 144 and the passivation layer 145 may not be formed in areas between the plurality of first plate patterns 121. The gate insulating layer 142, the first interlayer insulating layer 143, the second interlayer insulating layer 144 and the passivation layer 145 may be patterned into the shapes of the plurality of first plate patterns 121 and formed only on upper portions of the plurality of first plate patterns 121.

A planarization layer 146 is formed on the passivation layer 145. The planarization layer 146 serves to flatten upper portions of the switching transistor 150 and the driving transistor 160. The planarization layer 146 may be formed as a single layer or a plurality of layers and may be formed of an organic material. Thus, the planarization layer 146 may also be referred to as an organic insulating layer. For example, the planarization layer 146 may be formed of an acrylic-based organic material, but is not limited thereto.

Referring to FIG. 5, the planarization layer 146 may be disposed on the plurality of first plate patterns 121 so as to cover upper surfaces and side surfaces of the buffer layer 141, the gate insulating layer 142, the first interlayer insulating layer 143, the second interlayer insulating layer 144 and the passivation layer 145. In addition, the planarization layer 146 surrounds the buffer layer 141, the gate insulating layer 142, the first interlayer insulating layer 143, the second interlayer insulating layer 144 and the passivation layer 145 together with the plurality of first plate patterns 121. Specifically, the planarization layer 146 may be disposed to cover an upper surface and a side surface of the passivation layer 145, a side surface of the first interlayer insulating layer 143, a side surface of the second interlayer insulating layer 144, a side surface of the gate insulating layer 142, a side surface of the buffer layer 141 and a part of upper surfaces of the plurality of first plate patterns 121. Thus, the planarization layer 146 may compensate for steps between the side surfaces of the buffer layer 141, the gate insulating layer 142, the first interlayer insulating layer 143, the second interlayer insulating layer 144 and the passivation layer 145. Also, the planarization layer 146 may enhance adhesion strength between the planarization layer 146 and the connection lines 181 and 182 disposed on side surfaces of the planarization layer 146.

Referring to FIG. 5, an incline angle of the side surface of the planarization layer 146 may be less than those of the side surfaces of the buffer layer 141, the gate insulating layer 142, the first interlayer insulating layer 143, the second interlayer insulating layer 144 and the passivation layer 145. For example, the side surface of the planarization layer 146 may have a gentle incline than the side surface of the passivation layer 145, the side surface of the first interlayer insulating layer 143, the side surface of the second interlayer insulating layer 144, the side surface of the gate insulating layer 142 and the side surface of the buffer layer 141. Thus, the connection lines 181 and 182 in contact with the side surfaces of the planarization layer 146 are disposed to have a gentle incline. Therefore, when the display panel 100 of the display device is stretched, a stress generated in the connection lines 181 and 182 may be reduced. Also, it is possible to suppress cracks in the connection lines 181 and 182 or peeling of the connection lines 181 and 182 from the side surface of the planarization layer 146.

Referring to FIGS. 4 to 6, the connection lines 181 and 182 refer to lines that electrically connect the pads disposed on the plurality of first plate patterns 121. The connection lines 181 and 182 are disposed on the plurality of first line patterns 122. In addition, the connection lines 181 and 182 may also extend on the plurality of first plate patterns 121 to be electrically connected to the gate pad GP and the data pad DP on the plurality of first plate patterns 121. Also, referring to FIG. 7, the first line pattern 122 is not disposed in an area between the plurality of first plate patterns 121 in which the connection lines 181 and 182 are not disposed.

The connection lines 181 and 182 include the first connection lines 181 and the second connection lines 182. The first connection lines 181 and the second connection lines 182 are disposed between the plurality of first plate patterns 121. Specifically, the first connection lines 181 refer to lines extended in an X-axis direction X between the plurality of first plate patterns 121 among the connection lines 181 and 182. The second connection lines 182 refer to lines extended in a Y-axis direction between the plurality of first plate patterns 121 among the connection lines 181 and 182.

The connection lines 181 and 182 may be formed of a metal material such as copper (Cu), aluminum (Al), titanium (Ti) or molybdenum (Mo), or the connection lines 181 and 182 may have a laminated structure of metal materials such as copper/molybdenum-titanium (Cu/MoTi), titanium/aluminum/titanium (Ti/Al/Ti), or the like, but are not limited thereto.

In a display panel of a general display device, various lines such as a plurality of gate lines and a plurality of data lines are extended in straight lines and are disposed between a plurality of sub-pixels, and the plurality of sub-pixels are connected to a single signal line. Therefore, in the display panel of the general display device, various lines such as a gate line, a data line, a high-potential power line and a reference voltage line are continuously extended on a substrate from one side to the other side of an organic light emitting display device.

Unlike this, in the display panel 100 of the display device according to an example embodiment of the present disclosure, various lines such as a gate line, a data line, a high-potential power line and a reference voltage line which are formed in straight lines and considered to be used in a display panel of a general organic light emitting display device, are disposed only on the plurality of first plate patterns 121 and the plurality of second plate patterns 123. In the display panel 100 of the display device according to an example embodiment of the present disclosure, lines formed in straight lines are disposed only on the plurality of first plate patterns 121 and the plurality of second plate patterns 123.

In the display panel 100 of the display device according to an example embodiment of the present disclosure, the pads on two adjacent first plate patterns 121 may be connected by the connection lines 181 and 182. Accordingly, the connection lines 181 and 182 electrically connect the gate pads GP or the data pads DP on the two adjacent first plate patterns 121. Therefore, the display panel 100 of the display device according to an example embodiment of the present disclosure may include the plurality of connection lines 181 and 182 to electrically connect various lines, such as a gate line, a data line, a high-potential power line and a reference voltage line, between the plurality of first plate patterns 121. For example, gate lines may be disposed on the plurality of first plate patterns 121 disposed adjacent to each other in the first direction X. Also, the gate pads GP may be disposed on both ends of the gate lines. In this case, a plurality of gate pads GP on the plurality of first plate patterns 121 disposed adjacent to each other in the first direction X may be connected to each other by the first connection lines 181 serving as the gate lines. Therefore, the gate lines disposed on the plurality of first plate patterns 121 and the first connection lines 181 disposed on the first line patterns 122 may serve as single gate lines. Further, lines, such as a light emission signal line, a low-potential power line and a high-potential power line which are extended in the first direction X among all of various lines that may be included in the display panel 100 of the display device, may also be electrically connected by the first connection lines 181 as described above.

Referring to FIG. 4 and FIG. 6, the first connection lines 181 may connect the gate pads GP on two first plate patterns 121 that are disposed side by side among the gate pads GP on the plurality of first plate patterns 121 disposed adjacent to each other in the first direction X. The first connection line 181 may serve as a gate line, a light emission signal line, a high-potential power line, or a low-potential power line, but is not limited thereto. The gate pads GP on the plurality of first plate patterns 121 disposed in the first direction X may be connected by the first connection lines 181 serving as the gate lines. A single gate voltage may be transferred to the gate pads GP.

Further, referring to FIG. 4 and FIG. 5, the second connection lines 182 may connect the data pads DP on two first plate patterns 121 that are disposed side by side among the data pads DP on the plurality of first plate patterns 121 disposed adjacent to each other in the second direction Y. The second connection line 182 may serve as a data line, a high-potential power line, a low-potential power line or a reference voltage line, but is not limited thereto. Internal lines on the plurality of first plate patterns 121 disposed in the second direction Y may be connected by a plurality of second connection lines 182 serving as the data lines. A single data voltage may be transferred to the data lines.

As shown in FIG. 6, the first connection line 181 may be in contact with an upper surface and the side surface of the planarization layer 146 disposed on the first plate pattern 121. In addition, the first connection line 181 may be extended to an upper surface of the first line pattern 122. The second connection line 182 may be in contact with the upper surface and the side surface of the planarization layer 146 disposed on the first plate pattern 121. In addition, the second connection line 182 may be extended to the upper surface of the first line pattern 122.

However, as shown in FIG. 7, there is no need for a rigid pattern to be disposed in an area where the first connection line 181 and the second connection line 182 are not disposed. Thus, the first line pattern 122, which is a rigid pattern, is not disposed under the first connection line 181 and the second connection line 182.

Meanwhile, referring to FIG. 5, a bank 147 is formed on a connection pad CNT, the connection lines 181 and 182 and the planarization layer 146. The bank 147 is a component to distinguish adjacent sub-pixels SPX. The bank 147 is disposed to cover at least a part of the pad PD, the connection lines 181 and 182 and the planarization layer 146. The bank 147 may be formed of an insulating material. Further, the bank 147 may contain a black material. Since the bank 147 contains a black material, the bank 147 serves to hide lines which are visible through the active area AA. The bank 147 may be formed of, for example, a transparent carbon-based mixture. Specifically, the bank 147 may contain carbon black, but is not limited thereto. The bank 147 may also be formed of a transparent insulating material. Also, although a height of the bank 147 is shown to be lower than a height of the LED 170 in FIG. 5, the height of the bank 147 is not limited thereto, and the height of the bank 147 may be the same as the height of the LED 170.

Referring to FIG. 5, the LED 170 is disposed on the connection pad CNT and the first connection lines 181. The LED 170 includes an n-type layer 171, an active layer 172, a p-type layer 173, an n-electrode 174 and a p-electrode 175. The LED 170 of the display panel 100 of the display device according to an example embodiment of the present disclosure has a flip-chip structure in which the n-electrode 174 and the p-electrode 175 are formed on one surface thereof.

The n-type layer 171 may be formed by injecting n-type impurities into gallium nitride (GaN) having excellent crystallinity. The n-type layer 171 may be disposed on a separate base substrate which is formed of a light emitting material.

The active layer 172 is disposed on the n-type layer 171. The active layer 172 is a light emitting layer that emits light in the LED 170 and may be formed of a nitride semiconductor, for example, indium gallium nitride (InGaN). The p-type layer 173 is disposed on the active layer 172. The p-type layer 173 may be formed by injecting p-type impurities into gallium nitride (GaN).

As described above, the LED 170 according to an example embodiment of the present disclosure is manufactured by sequentially laminating the n-type layer 171, the active layer 172, and the p-type layer 173, and then, etching a predetermined area of the layers to thereby form the n-electrode 174 and the p-electrode 175. In this case, the predetermined area is a space to separate the n-electrode 174 and the p-electrode 175 from each other and is etched to expose a part of the n-type layer 171. In other words, a surface of the LED 170 on which the n-electrode 174 and the p-electrode 175 are to be disposed may not be flat and may have different levels of height.

In this manner, the n-electrode 174 is disposed in the etched area, and the n-electrode 174 may be formed of a conductive material. In addition, the p-electrode 175 is disposed in a non-etched area, and the p-electrode 175 may also be formed of a conductive material. For example, the n-electrode 174 is disposed on the n-type layer 171 exposed by an etching process, and the p-electrode 175 is disposed on the p-type layer 173. The p-electrode 175 may be formed of the same material as the n-electrode 174.

The n-electrode 174 is disposed on the etched area, i.e., on the n-type layer 171 which is exposed by etching. The n-electrode 174 may be formed of a conductive material.

Meanwhile, the p-electrode 175 is disposed on a non-etched area, i.e., on the p-type layer 173. The p-electrode 175 may be formed of a conductive material. For example, the p-electrode 175 may be formed of the same material as the n-electrode 174.

An adhesive layer AD is disposed on upper surfaces of the connection pad CNT and the first connection lines 181 and between the connection pad CNT and the first connection lines 181. Thus, the LED 170 may be bonded onto the connection pad CNT and the first connection lines 181. In this case, the n-electrode 174 may be disposed on the first connection lines 181 and the p-electrode 175 may be disposed on the connection pad CNT.

The adhesive layer AD may be a conductive adhesive layer formed by dispersing conductive balls in an insulating base member. Thus, when heat or pressure is applied to the adhesive layer AD, the conductive balls are electrically connected to have conductive properties in a portion of the adhesive layer AD to which heat or pressure is applied. Also, an area of the adhesive layer AD to which pressure is not applied may have insulating properties. For example, the n-electrode 174 is electrically connected to the first connection lines 181 through the adhesive layer AD, and the p-electrode 175 is electrically connected to the connection pad CNT through the adhesive layer AD. After applying the adhesive layer AD to upper surfaces of the first connection lines 181 and the connection pad CNT by an inkjet method or the like, the LED 170 may be transferred onto the adhesive layer AD. Then, the LED 170 may be pressed and heated to thereby electrically connect the connection pad CNT to the p-electrode 175 and the first connection lines 181 to the n-electrode 174. However, other portions of the adhesive layer AD excluding a portion of the adhesive layer AD between the n-electrode 174 and first connection lines 181 and a portion of the adhesive layer AD between the p-electrode 175 and the connection pad CNT have insulating properties. Meanwhile, the adhesive layer AD may be separately disposed on each of the connection pad CNT and the first connection lines 181.

Further, the connection pad CNT is electrically connected to the drain electrode 164 of the driving transistor 160 and receives a driving voltage for driving the LED 170 from the driving transistor 160. Furthermore, a low-potential driving voltage for driving the LED 170 is applied to the first connection lines 181. Thus, when the display panel 100 of the display device is turned on, different levels of voltage applied to each of the connection pad CNT and the first connection lines 181 are transferred to the n-electrode 174 and the p-electrode 175. Accordingly, the LED 170 emits light.

The upper substrate 112 serves to support various components disposed under the upper substrate 112. Specifically, the upper substrate 112 may be formed by coating and hardening a material for forming the upper substrate 112 on the lower substrate 111 and the first plate patterns 121. Thus, the upper substrate 112 may be disposed to be in contact with the lower substrate 111, the first plate patterns 121, the first line pattern 122 and the connection lines 181 and 182.

The upper substrate 112 may be formed of the same material as the lower substrate 111. For example, the upper substrate 112 may be formed of silicone rubber such as polydimethylsiloxane (PDMS) and an elastomer such as polyurethane (PU), and or polytetrafluoroethylene (PTFE). Thus, the upper substrate 112 may have flexibility. However, the materials of the upper substrate 112 are not limited thereto.

Meanwhile, although not shown in FIG. 5, a polarizing layer may also be disposed on the upper substrate 112. The polarizing layer polarizes light incident from the outside of the display panel 100 of the display device and reduces reflection of external light. Further, instead of the polarizing layer, other optical films or the like may be disposed on the upper substrate 112.

In addition, the filling layer 190 that is disposed on an entire surface of the lower substrate 111 and fills a gap between components disposed on the upper substrate 112 and the lower substrate 111 may be disposed. The filling layer 190 may be formed of a curable adhesive. Specifically, a material for forming the filling layer 190 is coated on the entire surface of the lower substrate 111 and then cured, so that the filling layer 190 may be disposed between components disposed on the upper substrate 112 and the lower substrate 111. For example, the filling layer 190 may be an optically clear adhesive (OCA), and may include an acrylic adhesive, a silicone adhesive, and a urethane adhesive.

Circuit Structure of Active Area

Figure 8:
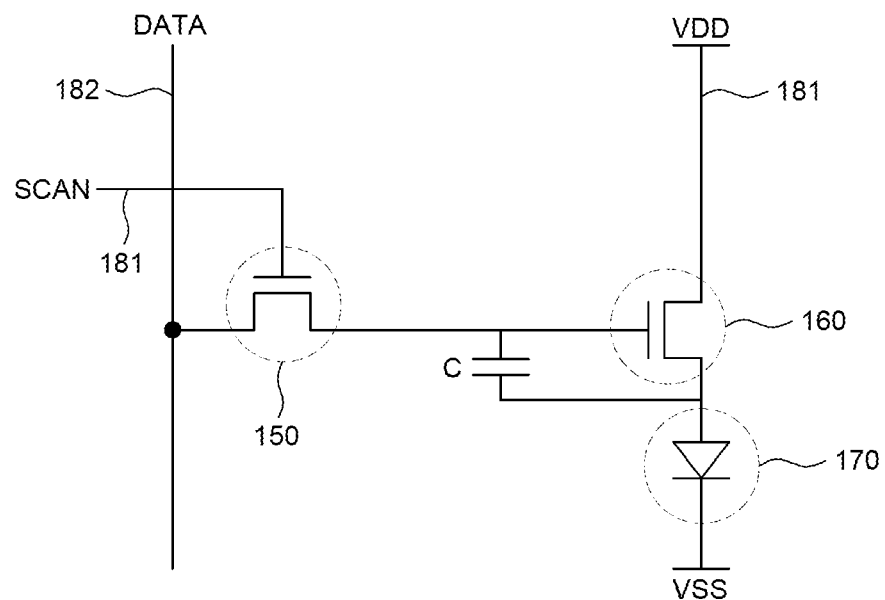
FIG. 8 is a circuit diagram of a sub-pixel of the display panel of the display device according to an example embodiment of the present disclosure.

FIG. 8 is a circuit diagram of a sub-pixel of the display device according to an example embodiment of the present disclosure.

Hereinafter, for the convenience of description, a structure and an operation when a sub-pixel SPX of the display panel of the display device according to an example embodiment of the present disclosure is a pixel circuit of 2T (transistor) 1C (capacitor) will be described. However, the present disclosure is not limited thereto.

Referring to FIG. 5 and FIG. 8, the sub-pixel SPX of the display panel of the display device according to an example embodiment of the present disclosure may be configured to include the switching transistor 150, the driving transistor 160, a storage capacitor C and the LED 170.

The switching transistor 150 applies a data signal DATA supplied through the second connection lines 182 to the driving transistor 160 and the storage capacitor C in response to a gate signal SCAN supplied through the first connection lines 181.

Further, the gate electrode 151 of the switching transistor 150 is electrically connected to the first connection lines 181. Also, the source electrode 153 of the switching transistor 150 is connected to the second connection lines 182. Further, the drain electrode 154 of the switching transistor 150 is connected to the gate electrode 161 of the driving transistor 160.

The driving transistor 160 may operate to enable a driving current according to a high-potential power VDD and the data voltage DATA supplied through the first connection lines 181 to flow in response to the data voltage DATA stored in the storage capacitor C.

Further, the gate electrode 161 of the driving transistor 160 is electrically connected to the drain electrode 154 of the switching transistor 150. The source electrode of the driving transistor 160 is connected to the first connection lines 181. The drain electrode 164 of the driving transistor 160 is connected to the LED 170.

The LED 170 may operate to emit light according to a driving current formed by the driving transistor 160. Also, as described above, the n-electrode 174 of the LED 170 may be connected to the first connection lines 181 and thus may be applied with a low-potential power VSS. Further, the p-electrode 175 of the LED 170 may be connected to the drain electrode 164 of the driving transistor 160 and thus may be applied with a driving voltage corresponding to the driving current.

The sub-pixel SPX of the display panel of the display device according to an example embodiment of the present disclosure is configured to have a 2T1C structure including the switching transistor 150, the driving transistor 160, the storage capacitor C and the LED 170. However, when a compensation circuit is added, the sub-pixel SPX may be configured in various ways, such as 3T1C, 4T2C, 5T2C, 6T1C, 6T2C, 7T1C or 7T2C.

As described above, the display panel of the display device according to an example embodiment of the present disclosure may include a plurality of sub-pixels on a first substrate which is a rigid substrate. Each of the plurality of sub-pixels SPX may include a switching transistor, a driving transistor, a storage capacitor and an LED.

Therefore, the display panel of the display device according to an example embodiment of the present disclosure may be stretched due to a lower substrate. Also, each first substrate includes a pixel circuit having a 2T1C structure. Thus, it is possible to emit light according to a data voltage at each gate timing.

Detailed Structure of First Area to Third Area

Figure 9A:
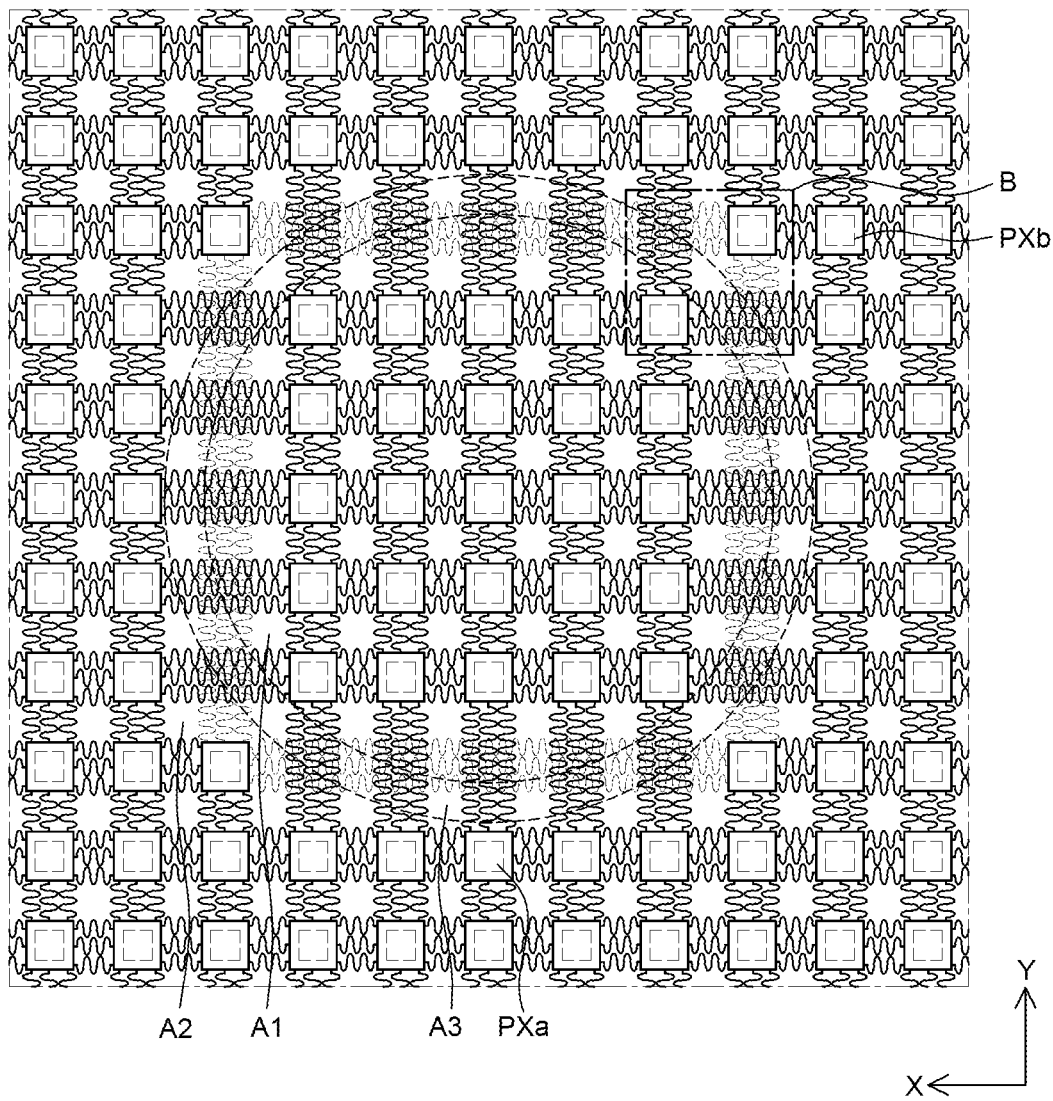
FIGS. 9A and 9B are plan views of a first area to a third area of the display panel of the display device according to an example embodiment of the present disclosure.
Figure 9B:
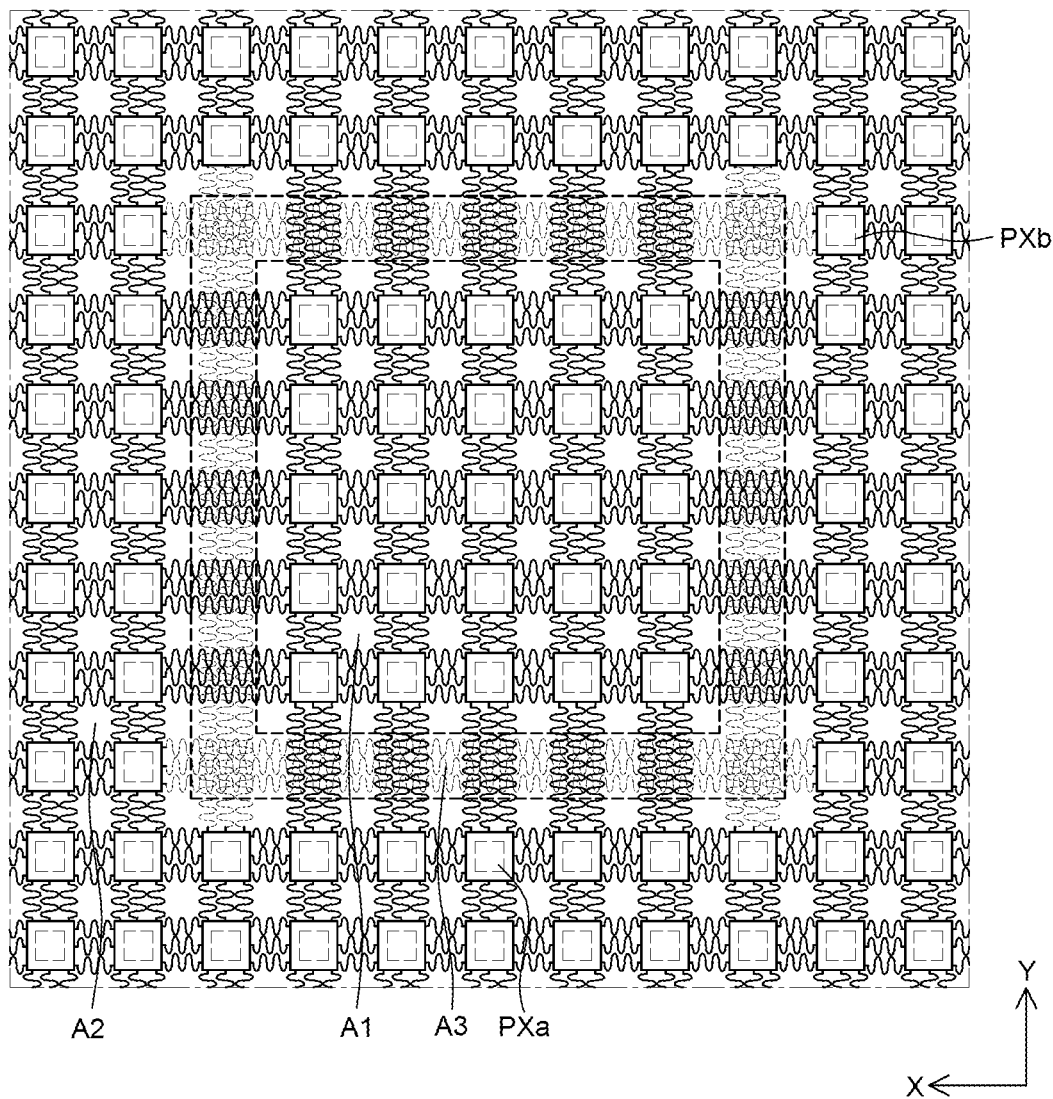

FIGS. 9A and 9B are plan views of a first area to a third area of the display panel of the display device according to an example embodiment of the present disclosure.

Figure 10:
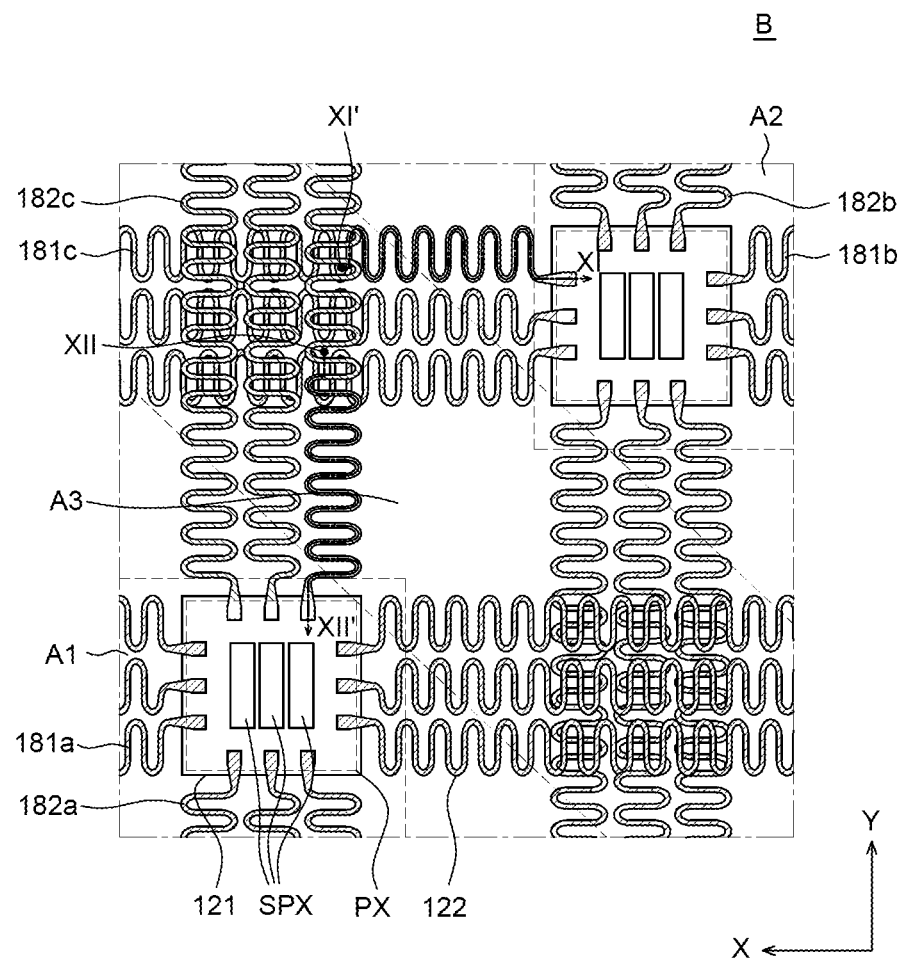
FIG. 10 is an enlarged plan view of the first area to the third area of the display panel of the display device according to an example embodiment of the present disclosure.

FIG. 10 is an enlarged plan view of the first area to the third area of the display panel of the display device according to an example embodiment of the present disclosure.

Specifically, FIG. 10 is an enlarged plan view of area B shown in FIG. 9A.

Referring to FIGS. 9A and 10, in the first area A1 and the second area A2, a plurality of pixels PXa and PXb and a plurality of connection lines 181a, 181b, 182a, and 182b connecting the plurality of pixels PXa and PXb are disposed, and in the third area A3, only a plurality of connection lines 181c and 182c connecting the plurality of pixels PXa and PXb disposed in the first area A1 and the second area A2 may be disposed.

As an example, although a shape of the first area A1 is illustrated in a circular shape in FIG. 9A, the present disclosure is not limited thereto, and as shown in FIG. 9B, the shape of the first area A1 may be a polygonal shape such as a quadrangular shape.

Referring to FIG. 10, the first connection lines 181 may include 1-1 sub-connection lines 181a disposed in the first area A1, 1-2 sub-connection lines 181b disposed in the second area A2, and 1-3 sub-connection lines 181c disposed in the third area A3. In addition, the second connection lines 182 may include 2-1 sub-connection lines 182a disposed in the first area A1, 2-2 sub-connection lines 182b disposed in the second area A2, and 2-3 sub-connection lines 182c disposed in the third area A3.

Referring to FIG. 10, the 1-1 sub-connection lines 181a are connection lines disposed in the first area A1 and extended in the first direction X. Also, the 2-1 sub-connection lines 182a are connection lines disposed in the first area A1 and extended in the second direction Y.

The 1-1 sub-connection lines 181a and the 2-1 sub-connection lines 182a electrically connect the plurality of pixels PXa disposed in the first area A1. Accordingly, the plurality of pixels PXa disposed in the first area A1 may be applied with various driving voltages such as a gate voltage and a data voltage through the 1-1 sub-connection lines 181a and the 2-1 sub-connection lines 182a.

In addition, in the second area A2, the 1-2 sub-connection lines 181b extended in the first direction X and the 2-2 sub-connection lines 182b extended in the second direction Y may be disposed.

The 1-2 sub-connection lines 181b and the 2-2 sub-connection lines 182b electrically connect the plurality of pixels PXb disposed in the second area A2. Accordingly, the plurality of pixels PXb disposed in the second area A2 may be applied with various driving voltages such as a gate voltage and a data voltage through the 1-2 sub-connection lines 181b and the 2-2 sub-connection lines 182b.

Both the 1-1 sub-connection lines 181a and the 2-1 sub-connection lines 182a disposed in the first area A1, and the 1-2 sub-connection lines 181b and the 2-2 sub-connection lines 182b disposed in the second area A2, as described above, may be formed of the same material on the same layer.

Specifically, both the 1-1 sub-connection lines 181a and the 2-1 sub-connection lines 182a disposed in the first area A1, and the 1-2 sub-connection lines 181b and the 2-2 sub-connection lines 182b disposed in the second area A2 may be formed of any one of various metal materials, for example, any one of molybdenum (Mo), aluminum (Al), chromium (Cr), gold (Au), titanium (Ti), nickel (Ni), neodymium (Nd) and copper (Cu). Alternatively, both the 1-1 sub-connection lines 181a and the 2-1 sub-connection lines 182a disposed in the first area A1, and the 1-2 sub-connection lines 181b and the 2-2 sub-connection lines 182b disposed in the second area A2 may be formed of an alloy of two or more of them, or a plurality of layer thereof, but are not limited thereto.

In addition, in the third area A3, the 1-3 sub-connection lines 181c extended in the first direction X and the 2-3 sub-connection lines 182c extended in the second direction Y may be disposed.

The 1-3 sub-connection lines 181c and the 2-3 sub-connection lines 182c electrically connect the pixels PXa disposed in the first area A1 and the pixels PXb disposed in the second area A2. Accordingly, the pixels PXa disposed in the first area A1 and the pixels PXb disposed in the second area A2 may be applied with various driving voltages such as a gate voltage and a data voltage through the 1-3 sub-connection lines 181c and the 2-3 sub-connection lines 182c.

In addition, the plurality of pixels PX may not be disposed in the third area A3. In the third area A3, the 1-3 sub-connection lines 181c are extended in the first direction X, and the 2-3 sub-connection lines 182c are extended in the second direction Y. Accordingly, in the third area A3, the 1-3 sub-connection lines 181c and the 2-3 sub-connection lines 182c may cross each other. The 1-3 sub-connection lines 181c and the 2-3 sub-connection lines 182c may overlap each other in the third area A3. Only in the third area A3, the 1-3 sub-connection lines 181c and the 2-3 sub-connection lines 182c may cross each other. Accordingly, an area where the 1-3 sub-connection lines 181c and the 2-3 sub-connection lines 182c overlap each other corresponds to the third area A3.

Referring to FIG. 10, widths of the 1-1 sub-connection lines 181a and the 2-1 sub-connection lines 182a disposed in the first area A1, and the 1-2 sub-connection lines 181b and the 2-2 sub-connection lines 182b disposed in the second area A2 may increase in areas overlapping the first plate patterns 121. For example, widths of the 1-1 sub-connection lines 181a, the 2-1 sub-connection lines 182a, the 1-2 sub-connection lines 181b, and the 2-2 sub-connection lines 182b that are positioned in the areas overlapping the first plate patterns 121 may be greater than widths of the 1-1 sub-connection lines 181a, the 2-1 sub-connection lines 182a, the 1-2 sub-connection lines 181b, and the 2-2 sub-connection lines 182b that are positioned in areas overlapping the first line patterns 122. Accordingly, widths of the 1-1 sub-connection lines 181a, the 2-1 sub-connection lines 182a, the 1-2 sub-connection lines 181b, and the 2-2 sub-connection lines 182b that are positioned on an upper surface of the planarization layer 146 may be greater than widths of the 1-1 sub-connection lines 181a, the 2-1 sub-connection lines 182a, the 1-2 sub-connection lines 181b, and the 2-2 sub-connection lines 182b that are positioned on upper surfaces of the first line patterns 122.

Hereinafter, a stacking relationship of the plurality of connection lines 181c and 182c disposed in the third area A3 of the display device according to an example embodiment of the present disclosure will be described with reference to FIGS. 11 and 12.

Figure 11:
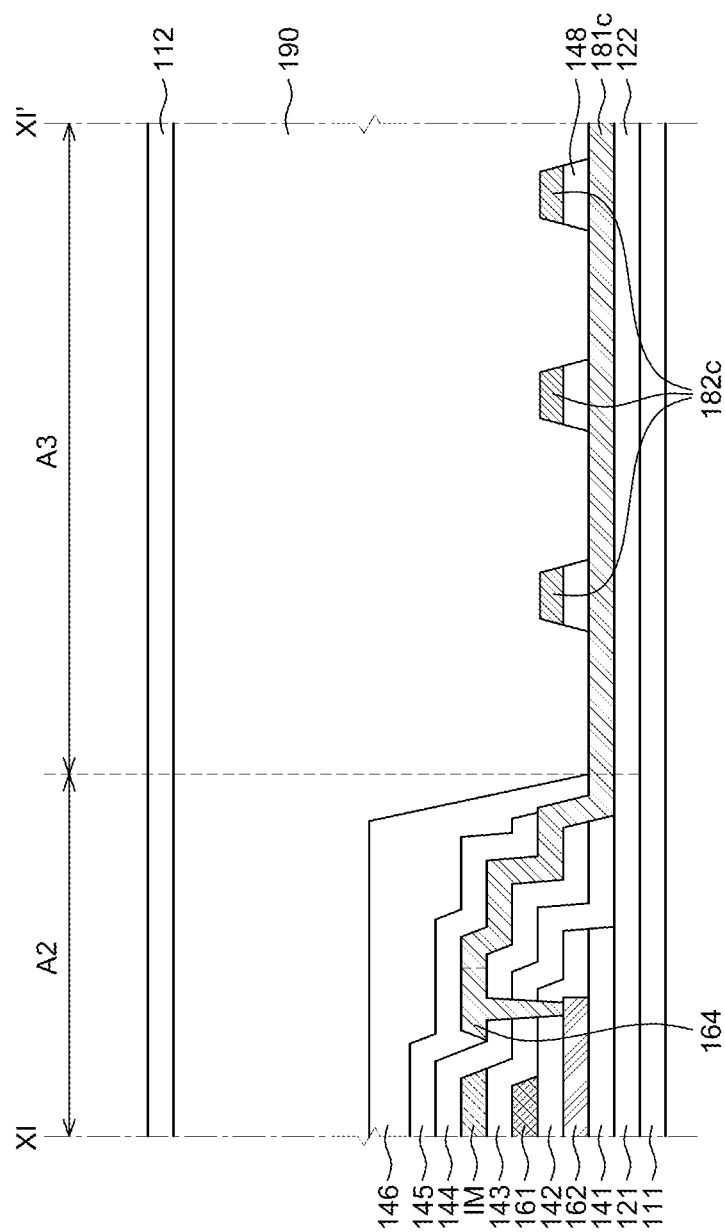
FIG. 11 is a cross-sectional view taken along cutting line XI-XI' shown in FIG. 10.

FIG. 11 is a cross-sectional view taken along cutting line XI-XI' shown in FIG. 10.

Figure 12:
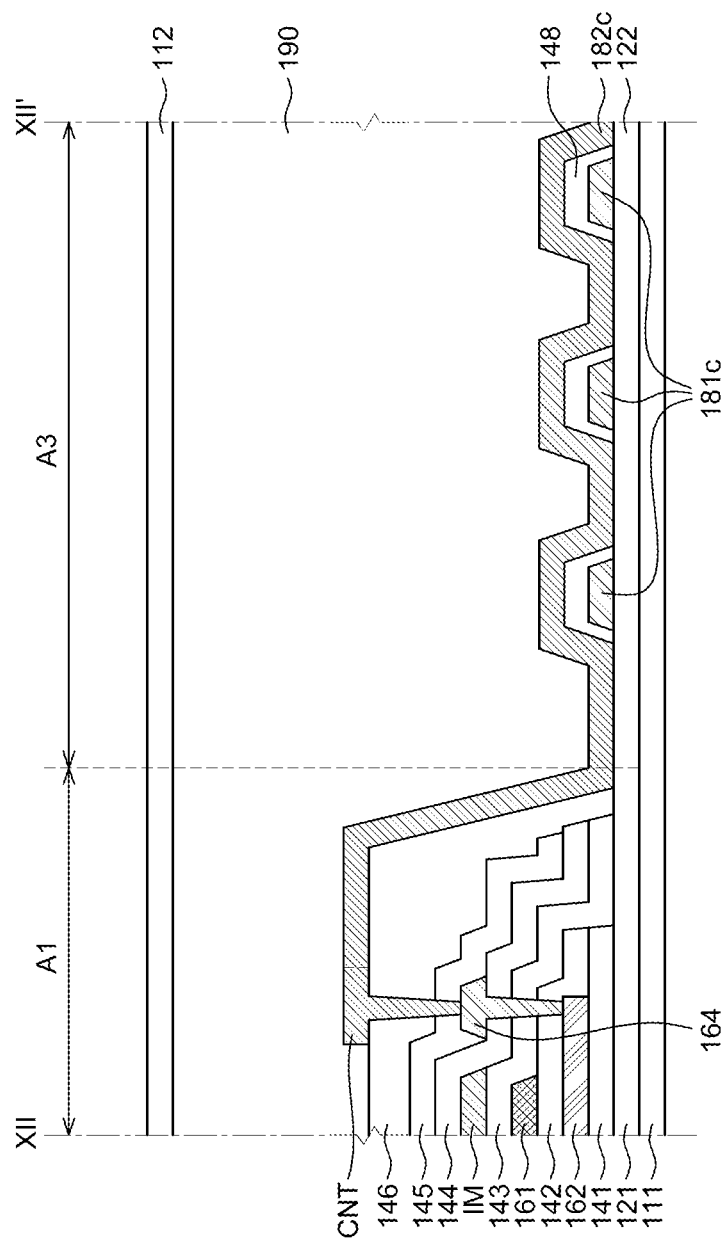
FIG. 12 is a cross-sectional view taken along cutting line XII-XII' shown in FIG. 10.

FIG. 12 is a cross-sectional view taken along cutting line XII-XII' shown in FIG. 10.

Specifically, FIG. 11 is a cross-sectional view taken along the 1-3 sub-connection lines 181c, and FIG. 12 is a cross-sectional view taken along the 2-3 sub-connection lines 182c. FIGS. 11 and 12 show not only the 1-3 sub-connection lines 181c and the 2-3 sub-connection lines 182c but also a part of the driving transistor 160 shown in FIG. 5.

As illustrated in FIG. 11, the 1-3 sub-connection line 181c is disposed on the first line pattern 122. And, between the 1-3 sub-connection line 181c and the 2-3 sub-connection line 182c in a cross area of the 1-3 sub-connection lines 181c and the 2-3 sub-connection lines 182c, an insulating pattern 148 is disposed.

The 1-3 sub-connection line 181c may be formed of the same material on the same layer as the source electrode and the drain electrode 164 of the driving transistor. That is, the 1-3 sub-connection line 181c may be formed of any one of various metal materials, for example, any one of molybdenum (Mo), aluminum (Al), chromium (Cr), gold (Au), titanium (Ti), nickel (Ni), neodymium (Nd) and copper (Cu). Alternatively, the 1-3 sub-connection line 181c may be formed of an alloy of two or more of them, or a plurality of layer thereof, but is not limited thereto.

In addition, the insulating pattern 148 is formed of the same material as the buffer layer 141, the gate insulating layer 142, the first interlayer insulating layer 143, the second interlayer insulating layer 144, and the passivation layer 145 which are inorganic insulating layers, or may be formed of the same material as the planarization layer 146 serving as the organic insulating layer. That is, the insulating pattern 148 may be formed as a single layer of silicon nitride (SiNx) or silicon oxide (SiOx) or multiple layers of silicon nitride (SiNx) or silicon oxide (SiOx), or an acryl-based organic material. However, the present disclosure is not limited thereto.

As illustrated in FIG. 12, the 2-3 sub-connection line 182c is disposed on the first line pattern 122. Specifically, in the cross area of the 1-3 sub-connection line 181c and the 2-3 sub-connection line 182c, the 1-3 sub-connection line 181c, the insulating pattern 148, and the 2-3 sub-connection line 182c are sequentially stacked on the first line pattern 122. And, in the cross area of the 1-3 sub-connection line 181c and the 2-3 sub-connection line 182c, between the 1-3 sub-connection line 181c and the 2-3 sub-connection line 182c, the insulating pattern 148 is disposed.

The 2-3 sub-connection line 182c may be formed on the same layer and formed of the same material as the connection pad CNT. The 2-3 sub-connection line 182c may be formed of any one of various metal materials, for example, any one of molybdenum (Mo), aluminum (Al), chromium (Cr), gold (Au), titanium (Ti), nickel (Ni), neodymium (Nd) and copper (Cu). Alternatively, the 2-3 sub-connection line 182c may be formed of an alloy of two or more of them, or a plurality of layer thereof, but is not limited thereto. The 2-3 sub-connection line 182c may be formed of the same material as the 1-1 sub-connection line 181a and the 2-1 sub-connection line 182a disposed in the first area A1, and the 1-2 sub-connection line 181b and the 2-2 sub-connection line 182b disposed in the second area A2.

As described with reference to FIGS. 11 and 12, the 1-3 sub-connection line 181c and the 2-3 sub-connection line 182c are not electrically connected to each other due to the insulating pattern 148. Accordingly, in the display device according to an example embodiment of the present disclosure, the 1-3 sub-connection line 181c and the 2-3 sub-connection line 182c may transmit different driving voltages.

In the display device according to an example embodiment of the present disclosure, only stretched lines may be disposed without disposing a plurality of pixels in the third area A3 that is inclined by the actuator. In addition, the first plate pattern 121 may not be disposed in the third area A3. Accordingly, a stretching rate of the third area may be improved compared to that of the first area A1 and the second area A2 in which an image is displayed. Accordingly, in the display device according to an example embodiment of the present disclosure, the actuator can effectively deform the display panel, so that the capability to implement a three-dimensional display can be improved in the display device according to an example embodiment of the present disclosure.

In addition, in the display device according to an example embodiment of the present disclosure, by disposing the 1-3 sub-connection line 181c and the 2-3 sub-connection line 182c that transfer different driving voltages to the third area A3 that is inclined by the actuator, a driving voltage may be applied to pixels disposed in the first area A1 and the second area A2 so that the display panel may realize a display.

Hereinafter, a display device according to another example embodiment of the present disclosure will be described. There is a difference between the display device according to another example embodiment and the display device according to an example embodiment in terms of a pixel arrangement relationship of the first area A1 and the third area A3. Accordingly, the display device according to another example embodiment of the present disclosure will be described with a focus on the pixel arrangement relationship between the first area A1 and the third area A3.

Another Example Embodiment of the Present Disclosure

Figure 13:
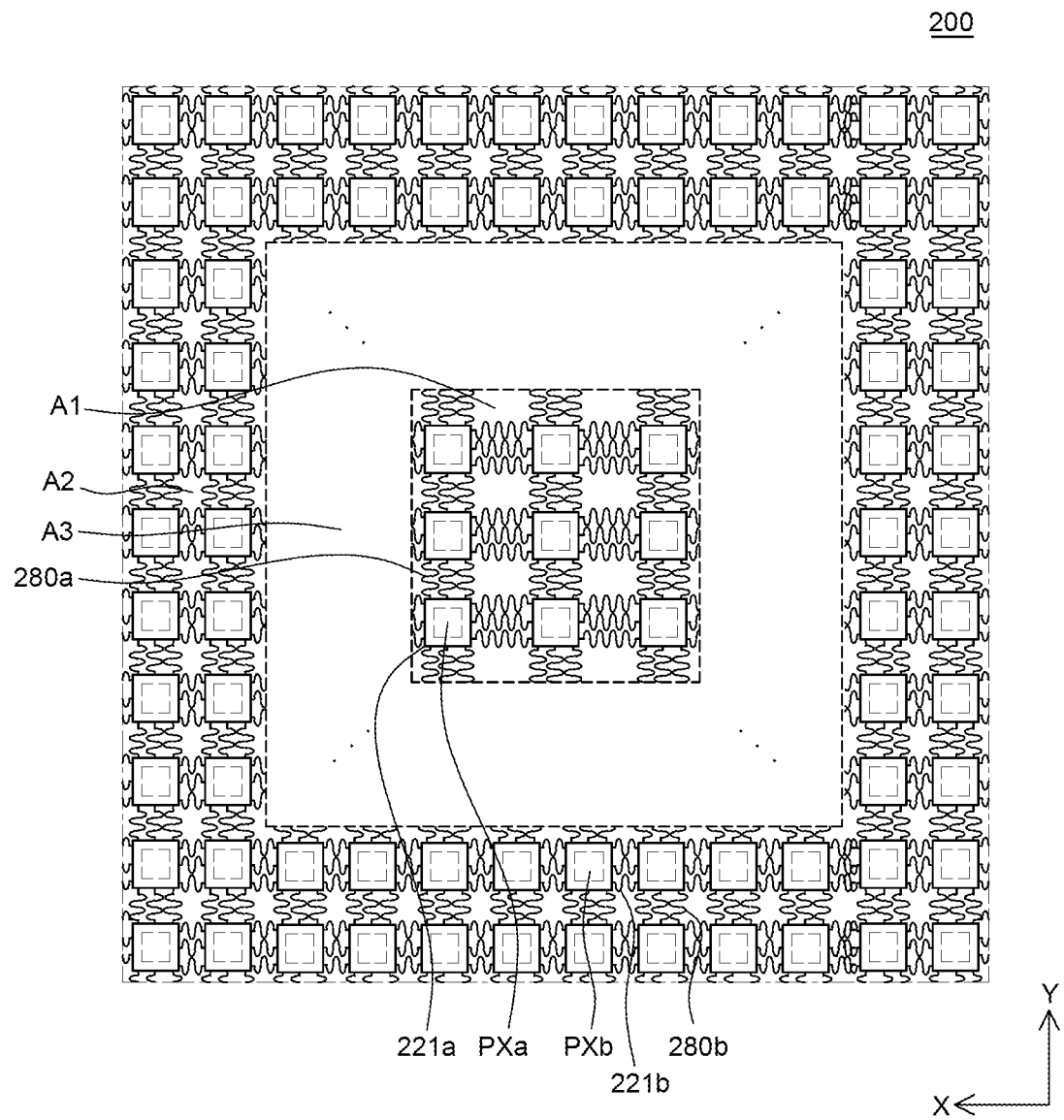
FIG. 13 is a plan view of a first area to a third area of a display panel of a display device according to another example embodiment of the present disclosure.

FIG. 13 is a plan view of a first area to a third area of a display panel of a display device according to another example embodiment of the present disclosure.

As illustrated in FIG. 13, in a display device 200 according to another example embodiment of the present disclosure, a plurality of pixels PXa and PXb and a plurality of connection lines 280a and 280b connecting the plurality of pixels PXa and PXb are disposed in the first area A1 and the second area A2. Although not specifically illustrated in FIG. 13, only a plurality of connection lines connecting the plurality of pixels PXa and PXb disposed in the first area A1 and the second area A2 are disposed even in the third area A3 of the display device according to another example embodiment of the present disclosure.

In addition, each of the plurality of pixels PXa disposed in the first area A1 is formed on the plurality of first plate patterns 221a disposed in the first area A1, and each of the plurality of pixels PXb disposed in the second area A2 is formed on the plurality of first plate patterns 221b disposed in the second area A2.

As illustrated in FIG. 13, in the display device 200 according to another example embodiment of the present disclosure, the plurality of pixels PXb disposed in the second area A2 may be denser than the pixels PXa disposed in the first area A1. That is, a distance between the plurality of pixels PXb disposed in the second area A2 may be shorter than a distance between the plurality of pixels PXa disposed in the first area A1.

Accordingly, in the display device 200 according to another example embodiment of the present disclosure, the plurality of first plate patterns 221b disposed in the second area A2 may be denser than the plurality of first plate patterns 221a disposed in the first area A1. That is, a distance between the plurality of first plate patterns 221b disposed in the second area A2 may be shorter than a distance between the plurality of first plate patterns 221a disposed in the first area A1.

Accordingly, a length of the connection line 280b disposed in the second area A2 may be shorter than a length of the connection line 280a disposed in the first area A1. Accordingly, a stretching rate of the connection line 280b disposed in the second area A2 may be lower than that of the connection line 280a disposed in the first area A1.

As a result, the stretching rate in the first area A1 may be higher than the stretching rate in the second area A2. Meanwhile, since a density of the plurality of pixels PXa disposed in the first area A1 is lower than a density of the plurality of pixels PXb disposed in the second area A2, a resolution of the first area A1 may be lower than a resolution of the second area A2.

In the display panel that is stretched by the actuator, stretching stress is more concentrated in the first area A1 that is protruded by the actuator than in the second area A2 that is not protruded by the actuator. Accordingly, in the display device according to another example embodiment of the present disclosure, by changing the arrangement relationship of the plurality of pixels PXa and PXb so that the stretching rate in the first area A1 is higher than the stretching rate in the second area A2, it is possible to effectively relieve the stretching stress applied to the first area A1. As a result, stretching reliability of the display device according to another example embodiment of the present disclosure may be improved.

Also, in the display panel that is stretched by the actuator, panel deformation frequency of the second area A2 that is not protruded by the actuator is relatively lower than that of the first area A1 that is protruded by the actuator. In the display device according to another example embodiment of the present disclosure, by setting the resolution of the second area A2 having a low panel deformation frequency to be higher than the resolution of the first area A1, it is possible to output a high-resolution image in the second area A2 having a low stretching frequency, thereby realizing a higher quality display device.

Hereinafter, a display device according to still another example embodiment (a third example embodiment) of the present disclosure will be described. There is a difference between the display device according to still another example embodiment (the third example embodiment) and the display device according to an example embodiment in terms of auxiliary plate patterns disposed in the first area. Accordingly, the display device according to still another example embodiment (the third example embodiment) of the present disclosure will be described with a focus on the auxiliary plate pattern.

Figure 14A:
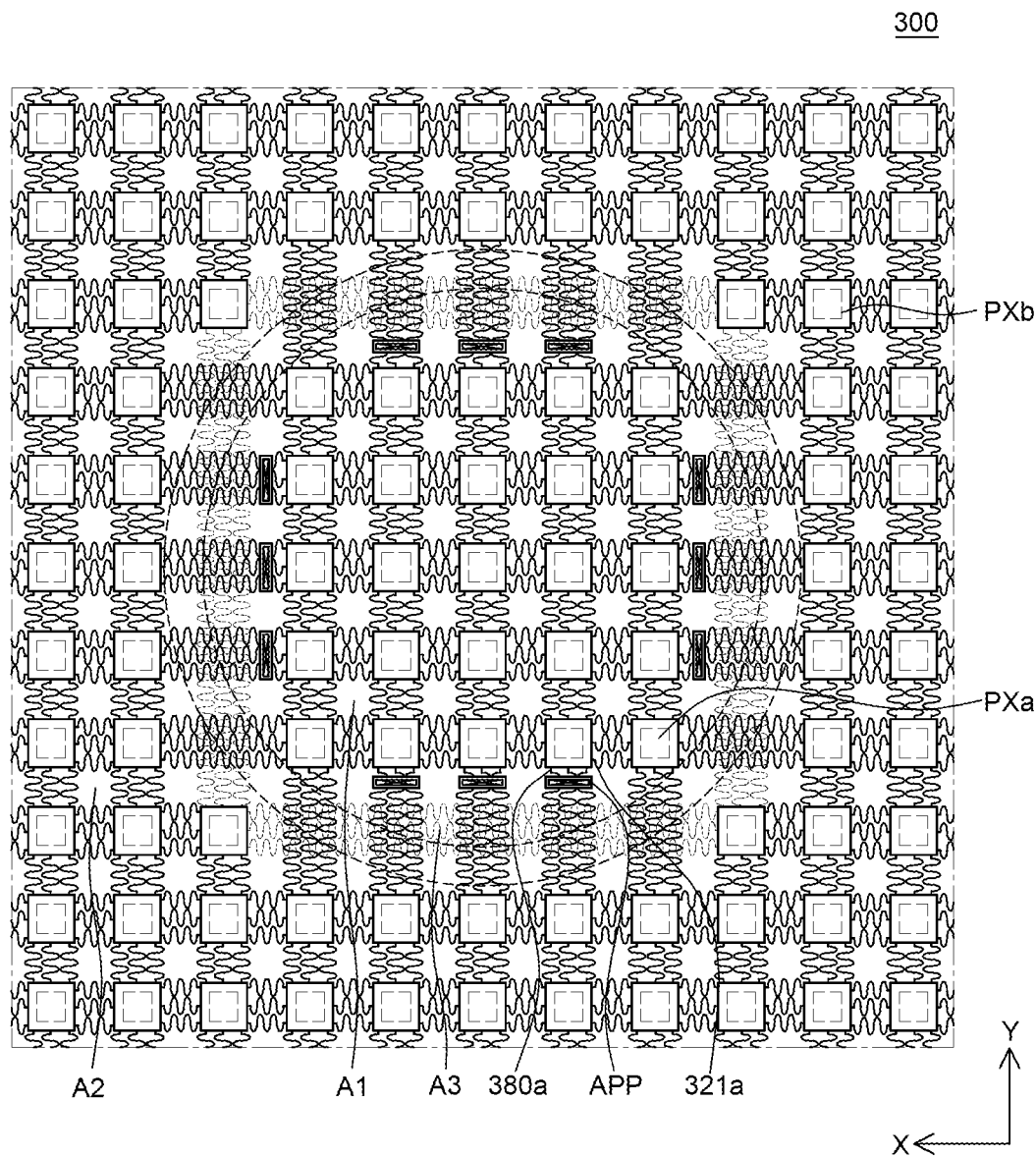
FIGS. 14A and 14B are plan views of a first area to a third area of a display panel of a display device according to still another example embodiment (a third example embodiment) of the present disclosure.
Figure 14B:
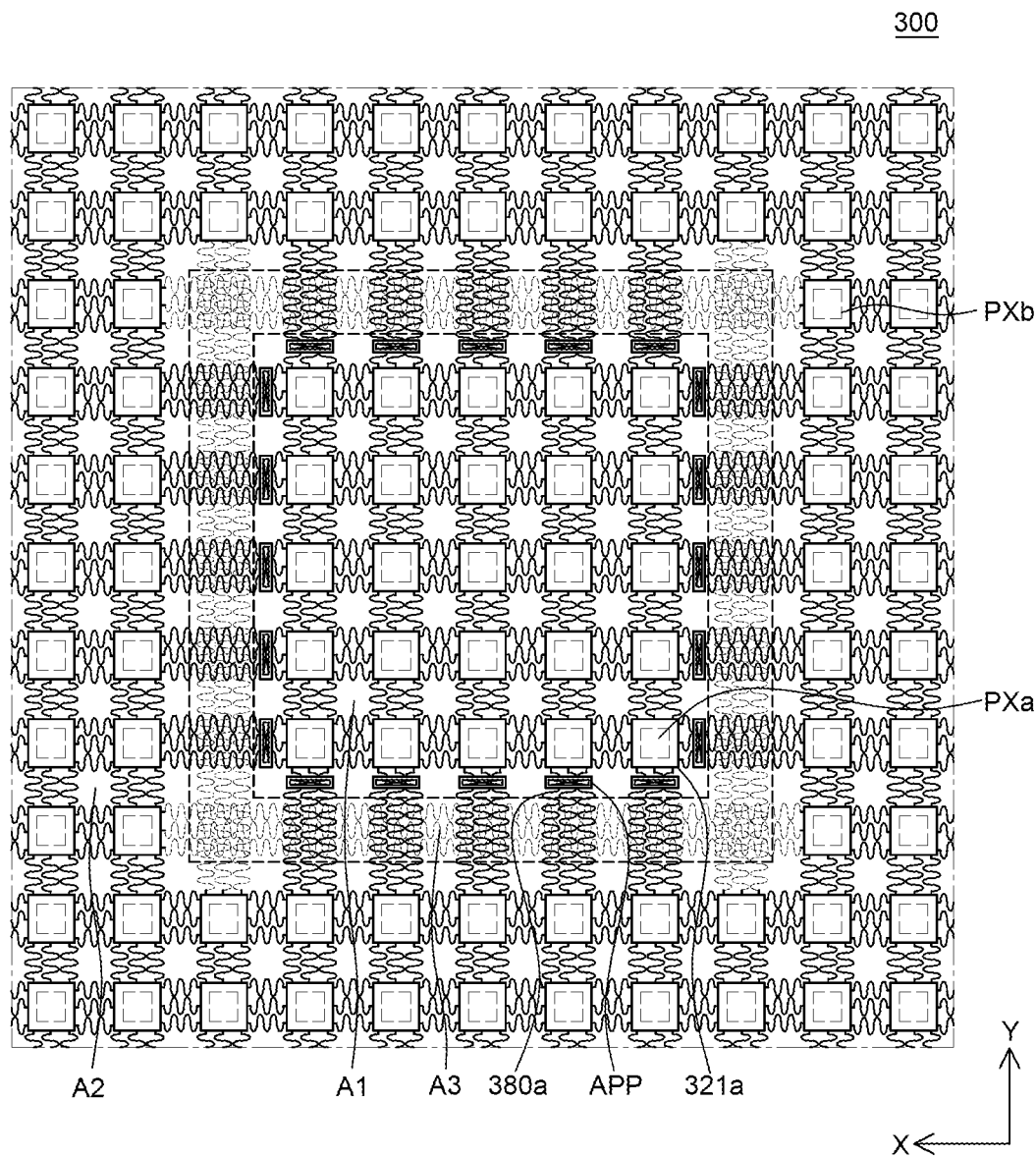

Still Another Example Embodiment of the Present Disclosure—Third Example Embodiment FIGS. 14A and 14B are plan views of a first area to a third area of a display panel of a display device according to still another example embodiment (a third example embodiment) of the present disclosure.

Figure 15:
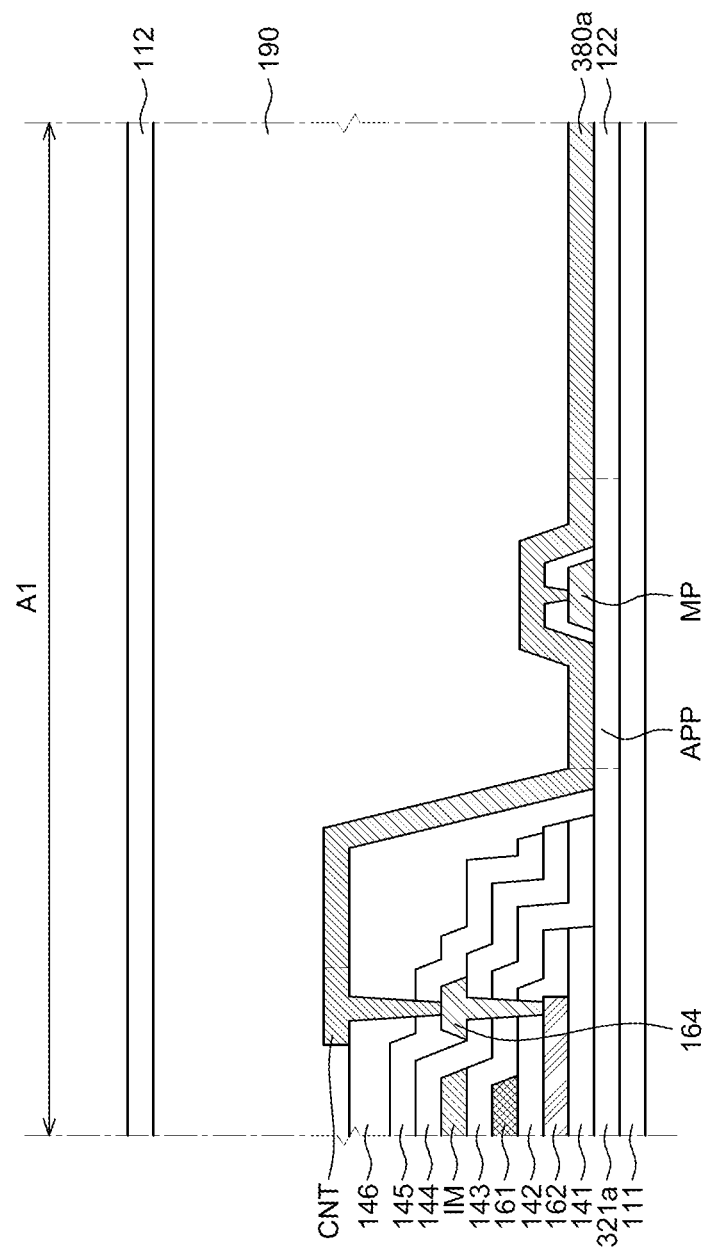
FIG. 15 is a cross-sectional view of the first area of the display panel of the display device according to still another example embodiment (the third example embodiment) of the present disclosure.

FIG. 15 is a cross-sectional view of the first area of the display panel of the display device according to still another example embodiment (the third example embodiment) of the present disclosure.

FIG. 14A illustrates a case in which a third area of a display panel of a display device 300 according to still another example embodiment (the third example embodiment) of the present disclosure has a circular shape, and FIG. 14B illustrates a case in which the third area of the display panel of the display device 300 according to still another example embodiment (the third example embodiment) of the present disclosure has a quadrangular shape.

FIG. 15 illustrates a cross-section for components disposed on an auxiliary plate pattern APP and a first plate pattern 321a disposed in the first area of the display panel of the display device 300 according to still another example embodiment (the third example embodiment) of the present disclosure. Components except for the first plate pattern 321a, the auxiliary plate pattern APP, and a metal pattern MP are the same as those described with reference to FIG. 12, and thus the same components are denoted by the same reference numerals.

In the display device 300 according to still another example embodiment (the third example embodiment) of the present disclosure, the auxiliary plate pattern APP may be further disposed outside a plurality of first plate patterns 321a disposed in the first area A1. For example, the auxiliary plate pattern APP may be further disposed between the plurality of first plate patterns 321a disposed in the first area A1 and the third area A3. More specifically, as shown in FIG. 15, the auxiliary plate pattern APP may be further disposed between the plurality of first plate patterns 321a and the plurality of first line patterns 122 in the first area A1.

Specifically, as shown in FIG. 14A, a plurality of auxiliary plate patterns APP are disposed in the second direction Y on respective both sides in the first direction X of the plurality of first plate patterns 321a disposed in the first area A1, and a plurality of auxiliary plate patterns APP are disposed in the first direction X on respective both sides in the second direction Y of the plurality of first plate patterns 321a disposed in the first area A1. Referring to FIG. 14A, the number of the auxiliary plate patterns APP arranged in the first direction X may be less than the number of first plate patterns 321a arranged in the first direction X. In addition, the number of auxiliary plate patterns APP arranged in the second direction Y may be less than the number of first plate patterns 321a arranged in the second direction Y.

Alternatively, as shown in FIG. 14B, a plurality of auxiliary plate patterns APP are disposed in the second direction Y on respective both sides in the first direction X of the plurality of first plate patterns 321a disposed in the first area A1, and a plurality of auxiliary plate patterns APP are disposed in the first direction X on respective both sides in the second direction Y of the plurality of first plate patterns 321a disposed in the first area A1. Referring to FIG. 14B, the number of the auxiliary plate patterns APP arranged in the first direction X may be the same as the number of the first plate patterns 321a arranged in the first direction X. In addition, the number of the auxiliary plate patterns APP arranged in the second direction Y may be the same as the number of first plate patterns 321a arranged in the second direction Y.

Also, as shown in FIG. 15, a connection line 380a may be disposed on the auxiliary plate pattern APP. That is, the auxiliary plate pattern APP and the connection line 380a may overlap. In addition, the connection line 380a disposed on the auxiliary plate pattern APP is in contact with a metal pattern MP disposed on a layer different from a plurality of connection lines 380a through an anchor hole. That is, on the auxiliary plate pattern APP, the connection line 380a and the metal pattern MP may overlap and may be physically connected through the anchor hole.

Specifically, the connection line 380a disposed on the auxiliary plate pattern APP may contact the metal pattern formed on the same layer as the source electrode and the drain electrode through the anchor hole. Alternatively, the connection line 380a disposed on the auxiliary plate pattern APP may contact the metal pattern formed on the same layer as the gate electrode through the anchor hole.

As described above, the connection line 380a may come into contact with the metal pattern through the anchor hole, and thus the connection line 380a may be stably fixed. In the display panel that is stretched by the actuator, stretching stress is more concentrated in an area outside the first area A1 protruded by the actuator. Accordingly, in the display device 300 according to still another example embodiment (the third example embodiment) of the present disclosure, by bringing the connection line 380a into contact with the metal pattern on the auxiliary plate pattern APP disposed in an outer area of the first area A1. It is possible to prevent a phenomenon in which the connection line is peeled off due to repeated stretching. As a result, the stretching reliability of the display device according to still another example embodiment (the third example embodiment) of the present disclosure may be improved.

Although it has been described that the auxiliary plate pattern APP is positioned only in the first area A1 in FIGS. 14A and 14B, the present disclosure is not limited thereto. For example, the auxiliary plate pattern APP may also be positioned in the second area A2. The auxiliary plate pattern APP may not be disposed in the third area A3, but may be disposed in at least one of the first area A1 and the second area A2.

Hereinafter, a display device according to still another example embodiment (a fourth example embodiment) of the present disclosure will be described. There is a difference between the display device according to still another example embodiment (the fourth example embodiment) and the display device according to an example embodiment of the present disclosure in terms of a thickness of a component disposed in a third area. Accordingly, the display device according to still another example embodiment (the fourth example embodiment) of the present disclosure will be described with a focus on the thickness of the component disposed in the third area.

Figure 16A:
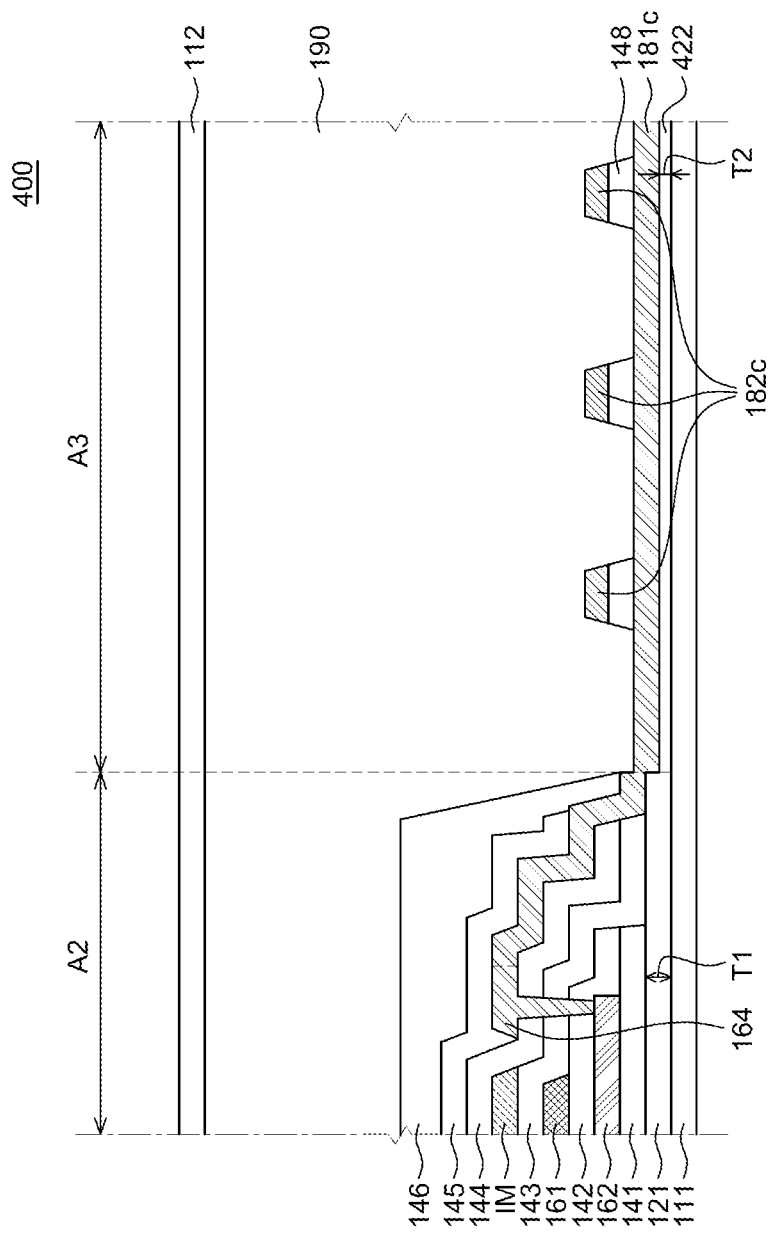
FIGS. 16A to 16C are cross-sectional views of a second area and a third area of a display panel of a display device according to still another example embodiment (a fourth example embodiment) of the present disclosure.
Figure 16B:
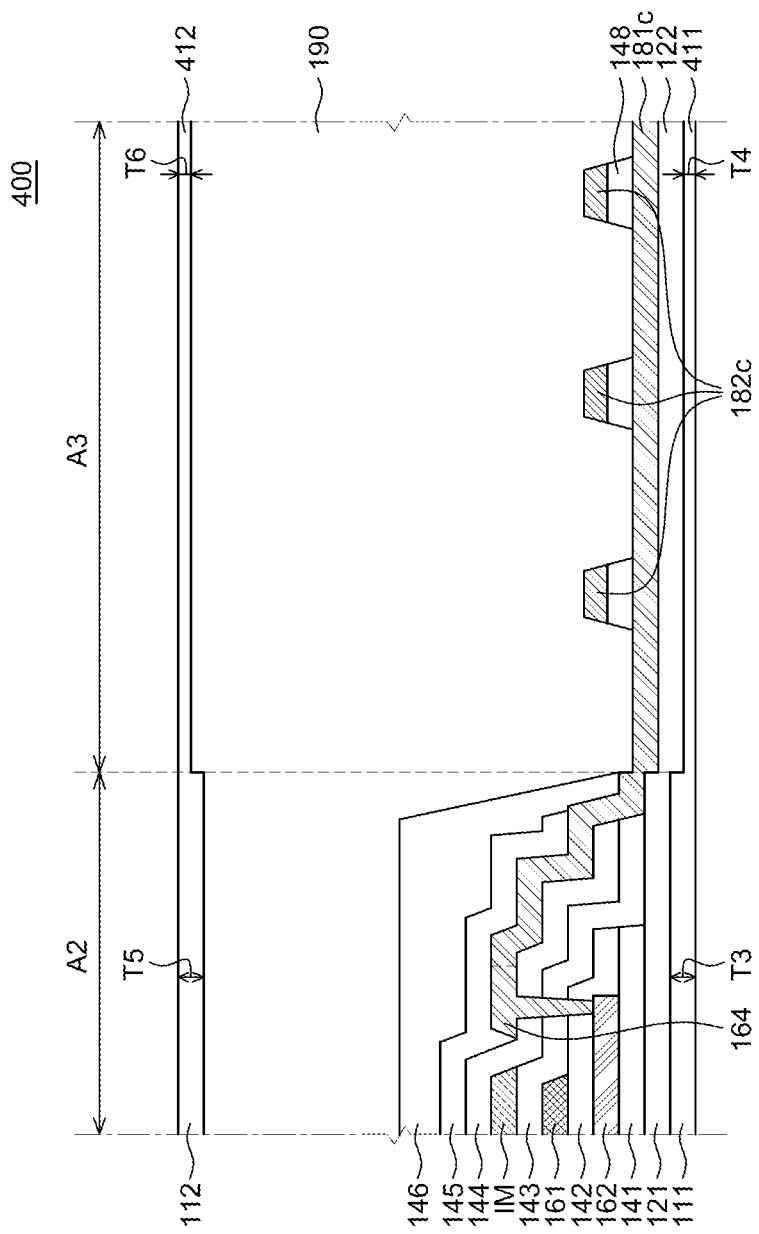
Figure 16C:
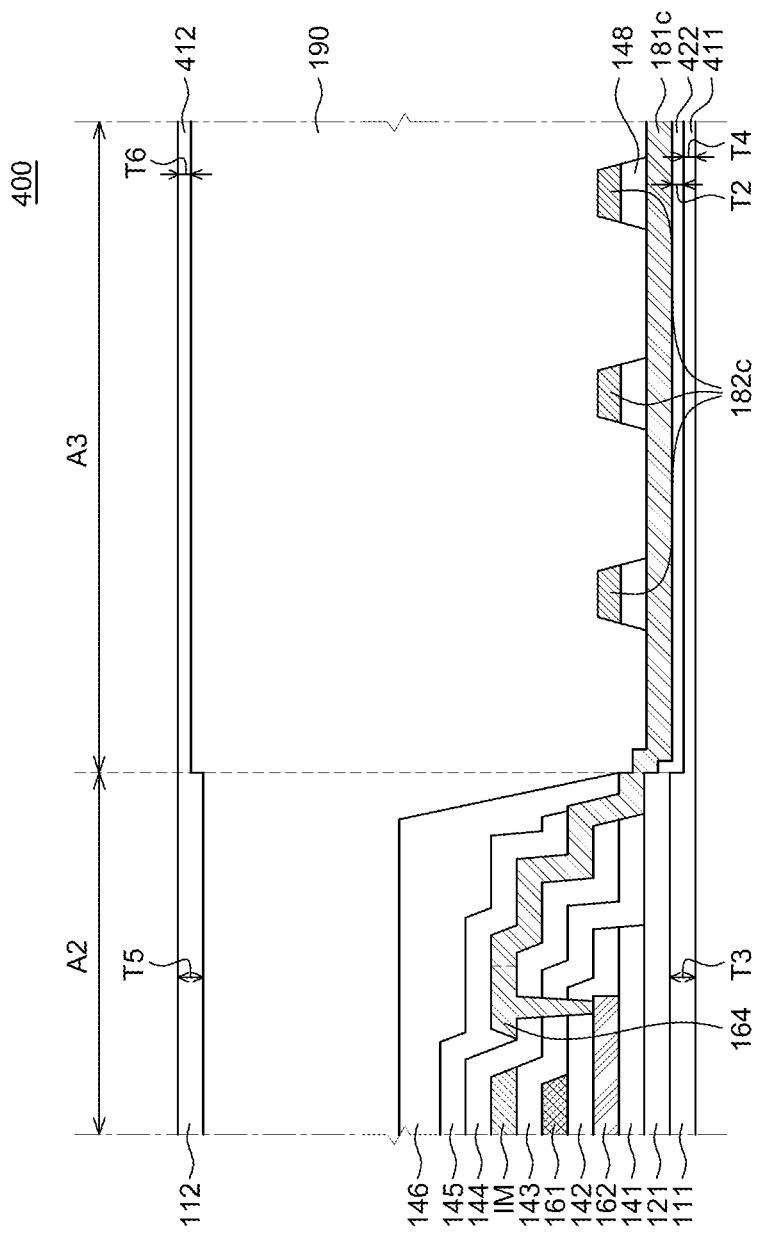

Still Another Example Embodiment of the Present Disclosure—Fourth Example Embodiment FIGS. 16A to 16C are cross-sectional views of a second area and a third area of a display panel of a display device according to still another example embodiment (the fourth example embodiment) of the present disclosure.

Specifically, in FIG. 16A, in a display device 400 according to still another example embodiment (the fourth example embodiment) of the present disclosure, it is illustrated that a thickness T2 of a first line pattern 422 disposed in a third area A3 decreases.

In FIG. 16B, in the display device 400 according to still another example embodiment (the fourth example embodiment) of the present disclosure, it is illustrated that a thickness T6 of an upper substrate 412 and a thickness T4 of a lower substrate 411 decrease.

In FIG. 16B, in the display device 400 according to still another example embodiment (the fourth example embodiment) of the present disclosure, it is illustrated that thicknesses T of the first line pattern 422, the upper substrate 412, and the lower substrate 411 disposed in the third area A3 decrease.

In the display device 400 according to still another example embodiment (the fourth example embodiment) of the present disclosure, a thickness of at least one of the first line pattern 422, the upper substrate 412, and the lower substrate 411 that are disposed in the third area A3 may be thinner than a thickness of at least one of the first plate pattern 121, the upper substrate 112, and the lower substrate 111 that are disposed in a first area and a second area A2.

Specifically, as shown in FIG. 16A, the thickness T2 of the first line pattern 422 disposed in the third area A3 may be thinner than a thickness T1 of the first plate pattern 121 disposed in the first area and the second area A2.

Alternatively, as shown in FIG. 16B, the thickness T6 of the upper substrate 412 disposed in the third area A3 may be thinner than a thickness T5 of the upper substrate 112 disposed in the first area A1 and the second area A2, or the thickness T4 of the lower substrate 411 disposed in the third area A3 may be thinner than a thickness T3 of the lower substrate 112 disposed in the first area A1 and the second area A2.

Alternatively, as shown in FIG. 16C, the thickness T2 of the first line pattern 422 disposed in the third area A3 may be less than the thickness T1 of the first plate pattern 121 disposed in the first area A1 and the second area A2. Alternatively, the thickness T6 of the upper substrate 412 disposed in the third area A3 may be less than the thickness T5 of the upper substrate 112 disposed in the first area and the second area A2. Alternatively, the thickness T4 of the lower substrate 411 disposed in the third area A3 may be less than the thickness T3 of the lower substrate 112 disposed in the first area A1 and the second area A2.

As described above, in the display device 400 according to still another example embodiment (the fourth example embodiment) of the present disclosure, a thickness of at least one of components disposed in the third area A3 may decrease. Accordingly, in the display device 400 according to still another example embodiment (the fourth example embodiment) of the present disclosure, a stretching rate of the third area A3 may be more effectively improved. Accordingly, in the display device 400 according to still another example embodiment (the fourth example embodiment) of the present disclosure, the actuator can effectively deform the display panel, so that the display device 400 can improve the capability to implement a three-dimensional display.

Hereinafter, a display device according to still another example embodiment (a fifth example embodiment) of the present disclosure will be described. There is a difference between the display device according to still another example embodiment of the present disclosure and the display device according to an example embodiment of the present disclosure in terms of connection lines disposed in a third area. Accordingly, the display device according to still another example embodiment (the fifth example embodiment) of the present disclosure will be described with a focus on the connection lines disposed in the third area.

Figure 17:
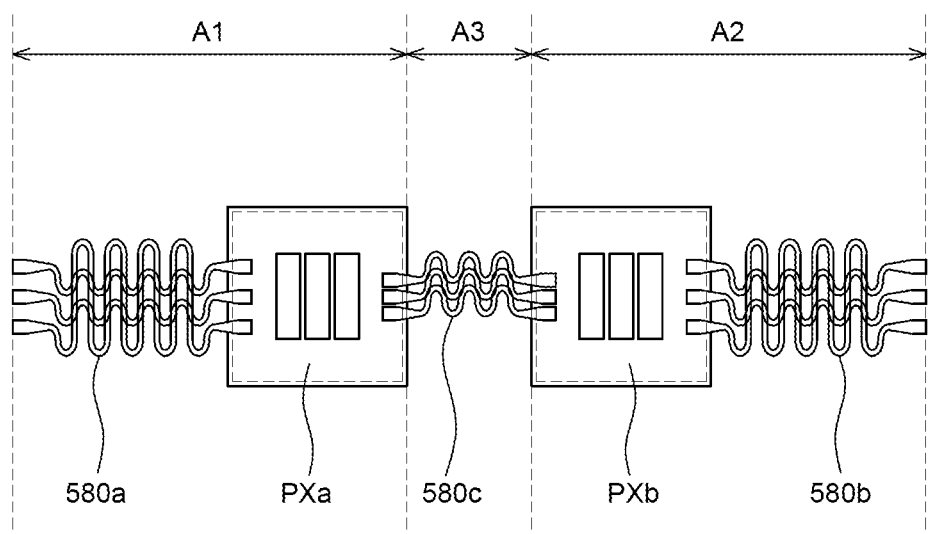
FIG. 17 is a plan view of a first area to a third area of a display panel of a display device according to still another example embodiment (a fifth example embodiment) of the present disclosure.

Still Another Example Embodiment of the Present Disclosure—Fifth Example Embodiment FIG. 17 is a plan view of a first area to a third area of a display panel of a display device according to still another example embodiment (a fifth example embodiment) of the present disclosure.

Figure 18:
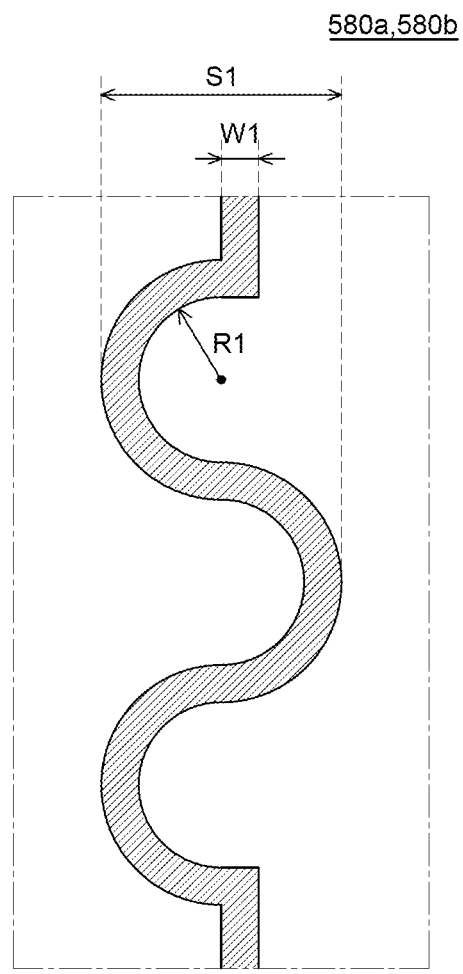
FIG. 18 is an enlarged plan view of connection lines disposed in the first area and a second area of the display panel of the display device according to still another example embodiment (the fifth example embodiment) of the present disclosure.

FIG. 18 is an enlarged plan view of connection lines disposed in a first area and a second area of the display panel of the display device according to still another example embodiment (the fifth example embodiment) of the present disclosure.

Figure 19A:
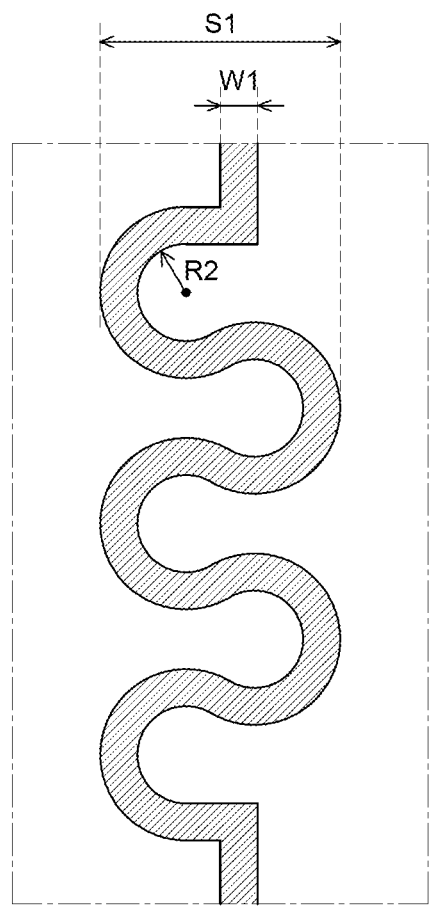
FIGS. 19A to 19C are enlarged plan views of connection lines disposed in the third area of the display panel of the display device according to still another example embodiment (the fifth example embodiment) of the present disclosure.
Figure 19B:
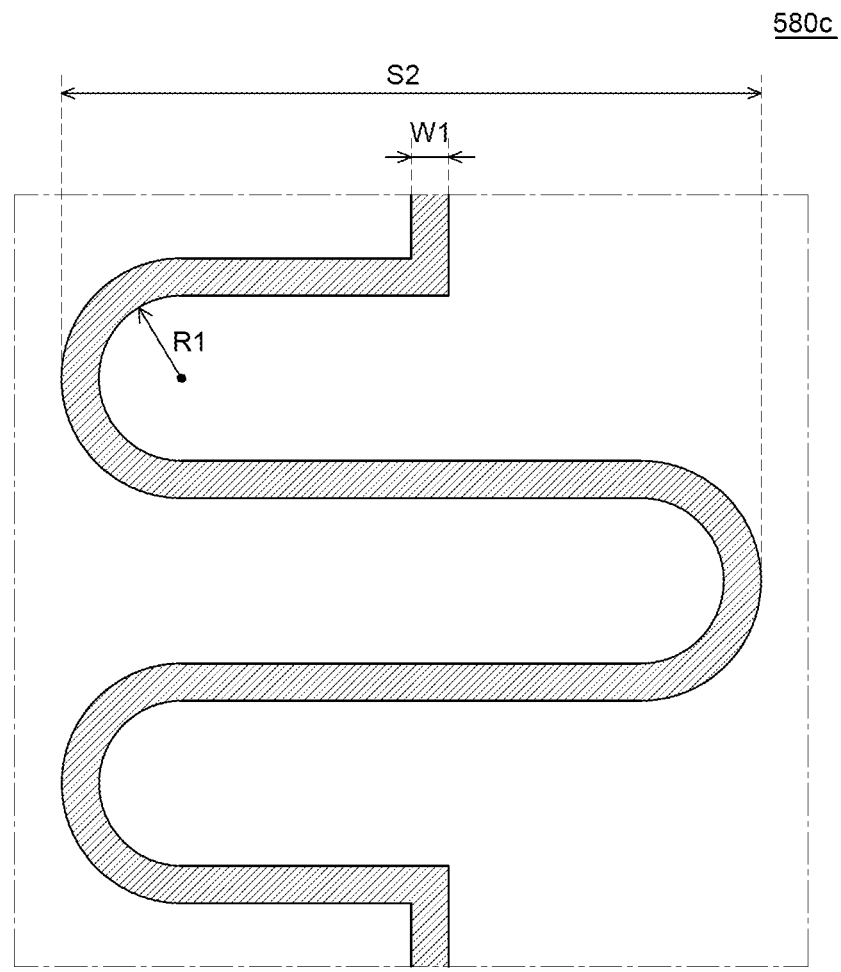
Figure 19C:
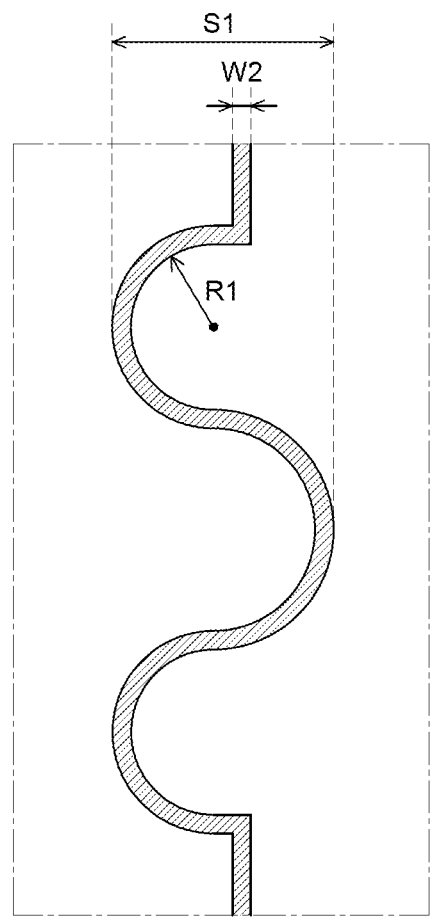

FIGS. 19A to 19C are enlarged plan views of connection lines disposed in the third area of the display panel of the display device according to still another example embodiment (the fifth example embodiment) of the present disclosure.

As illustrated in FIG. 17, in a display device 500 according to still another example embodiment (the fifth example embodiment) of the present disclosure, a plurality of pixels PXa and PXb and a plurality of connection lines 580a and 580b connecting the plurality of pixels PXa and PXb are disposed in a first area A1 and a second area A2. Also, in a third area A3, only a plurality of connection lines 580c connecting the plurality of pixels PXa and PXb disposed in the first area A1 and the second area A2 are disposed.

In addition, the connection lines 580a, 580b, and 580c disposed in the first area A1 to the third area A3 may have a wavy shape in order to be stretched.

Specifically, in FIG. 18, the connection lines 580a and 580b disposed in the first area A1 and the second area A2 are illustrated to have a sine wave shape in which they have a first radius of curvature R1, a first amplitude S1, and a first width W1.

The above-described first radius of curvature R1 refers to a radius of curved circular portions of the connection lines 580a and 580b disposed in the first area A1 and the second area A2. And, the first amplitude S1 refers to a maximum amplitude at which the connection lines 580a and 580b disposed in the first area A1 and the second area A2 swing in a direction perpendicular to an extending direction of the connection lines 580a and 580b disposed in the first area A1 and the second area A2. In addition, the first width W1 refers to a cross-sectional width of the connection lines 580a and 580b disposed in the first area A1 and the second area A2 based on a plan view.

As described above, in order to reduce stretching stress in the third area A3, it is beneficial for a stretching rate of the connection line 580c disposed in the third area A3 be higher than those of the connection lines 580a and 580b disposed in the first area A1 and the second area A2.

Accordingly, the connection line 580c disposed in the third area A3 may be formed in a shape wavier than the connection lines 580a and 580b disposed in the first area A1 and the second area A2. Alternatively, the connection line 580c disposed in the third area A3 may be thinner than the connection lines 580a and 580b disposed in the first area A1 and the second area A2.

Specifically, referring to FIG. 19A, the connection line 580c disposed in the third area A3 may have a wavy shape having a second radius of curvature R2, a first amplitude S1, and a first width W1. In addition, the second radius of curvature R2 may be less than the first radius of curvature R1. That is, the radius of curvature R2 of the connection line 580c disposed in the third area A3 may be less than the radius of curvature R2 of the connection line 580a and 580b disposed in the first area A1 and the second area A2.

Accordingly, the connection line 580c disposed in the third area A3 may be formed to be wavier than the connection lines 580a and 580b disposed in the first area A1 and the second area A2. Thus, the connection line 580c disposed in the third area A3 may have a higher stretching rate than the connection lines 580a and 580b disposed in the first area A1 and the second area A2.

Next, referring to FIG. 19B, the connection line 580c disposed in the third area A3 may have a wavy shape having a first radius of curvature R1, a second amplitude S2 and a first width W1. In addition, the second amplitude S2 may be greater than the first amplitude S1. That is, the amplitude S2 of the connection line 580c disposed in the third area A3 may be greater than the amplitude S1 of the connection lines 580a and 580b disposed in the first area A1 and the second area A2.

Accordingly, the connection line 580c disposed in the third area A3 may be formed to be wavier than the connection lines 580a and 580b disposed in the first area A1 and the second area A2. Thus, the connection line 580c disposed in the third area A3 may have a higher stretching rate than the connection lines 580a and 580b disposed in the first area A1 and the second area A2.

Finally, referring to FIG. 19C, the connection line 580c disposed in the third area A3 may have a sine wave shape having a first radius of curvature R1, a first amplitude S1, and a second width W2. Also, the second width W2 may be narrower than the first width W1. That is, the width W2 of the connection line 580c disposed in the third area A3 may be narrower than the width W1 of the connection lines 580a and 580b disposed in the first area A1 and the second area A2.

Accordingly, the connection line 580c disposed in the third area A3 may be formed to be wavier than the connection lines 580a and 580b disposed in the first area A1 and the second area A2. Thus, the connection line 580c disposed in the third area A3 may have a higher stretching rate than the connection lines 580a and 580b disposed in the first area A1 and the second area A2.

As described above, by setting the radius of curvature R2 of the connection line 580c disposed in the third area A3 to be small, or by setting the amplitude S2 to be large, or by setting the width W2 to be narrow, the stretching rate of the connection line 580c disposed in the area A3 may be improved.

As described above, in the display device 500 according to still another example embodiment (the fifth example embodiment) of the present disclosure, the stretching rate of the connection line 580c disposed in the third area A3 may be relatively improved. Accordingly, in the display device 500 according to still another example embodiment (the fifth example embodiment) of the present disclosure, the stretching rate of the third area A3 may be more effectively improved. Accordingly, in the display device according to still another example embodiment (the fifth example embodiment) of the present disclosure, the actuator can effectively deform the display panel, so that the display device can have an improved capability of realizing a three-dimensional display.

The example embodiments of the present disclosure can also be described as follows:

A display device according to an example embodiment of the present disclosure includes a stretchable display panel; and an actuator configured to deform the display panel, wherein the display panel includes a first area that is protruded by the actuator, a second area that is not protruded by the actuator, and a third area that is between the first area and the second area, wherein a plurality of pixels are disposed in the first area and the second area, wherein in the third area, only a plurality of connection lines connecting the plurality of pixels disposed in the first area and the plurality of pixels disposed in the second area are disposed, so that three-dimensional display capability of the display device can be improved.

In the third area of the display panel, a stretchable lower substrate; a plurality of line patterns disposed on the lower substrate; the plurality of connection lines disposed on each of the plurality of line patterns; and an upper substrate covering the plurality of connection lines may be disposed.

The plurality of connection lines disposed in the third area may include a 1-3 connection line extended in a first direction and a 2-3 connection line extended in a second direction.

The 1-3 connection line and the 2-3 connection line may be formed of different metal layers.

An insulating pattern configured to insulate the 1-3 connection line and the 2-3 connection line may be disposed in a cross area of the 1-3 connection line and the 2-3 connection line.

The third area may be inclined with respect to the second area.

The plurality of pixels disposed in the second area may be denser than the plurality of pixels disposed in the first area.

A length of each of the plurality of connection lines disposed in the second area may be shorter than a length of each of the plurality of connection lines disposed in the first area.

An auxiliary plate pattern may be further disposed outside a plurality of plate patterns disposed in the first area.

A plurality of connection lines may be disposed on the auxiliary plate pattern, and each of the plurality of connection lines may be in contact with a metal pattern disposed on a layer different from the plurality of connection lines through an anchor hole.

In each of the first area and the second area of the display panel, a stretchable lower substrate; a pattern layer disposed on the lower substrate and including a plurality of plate patterns and a plurality of line patterns; a plurality of pixels disposed on each of the plurality of plate patterns; a plurality of connection lines disposed on each of the plurality of line patterns; and an upper substrate covering the plurality of pixels and the plurality of connection lines may be disposed.

The plurality of connection lines disposed in the first area may include a 1-1 connection line extended in a first direction and a 2-1 connection line extended in a second direction, wherein the 1-1 connection line and the 2-1 connection line may be disposed on the same layer.

The plurality of connection lines disposed in the second area may include a 1-2 connection line extended in a first direction and a 2-2 connection line extended in a second direction, wherein the 1-2 connection line and the 2-2 connection line may be disposed on the same layer.

A thickness of the pattern layer disposed in the third area may be thinner than a thickness of the pattern layer disposed in the first area and the second area.

A thickness of the upper substrate disposed in the third area may be thinner than a thickness of the upper substrate disposed in the first area and the second area.

A thickness of the lower substrate disposed in the third area may be thinner than a thickness of the lower substrate disposed in the first area and the second area.

A radius of curvature of the connection line disposed in the third area may be shorter than a radius of curvature of the connection line disposed in the first area and the second area.

An amplitude of the connection line disposed in the third area may be greater than an amplitude of the connection line disposed in the first area and the second area.

A width of the connection line disposed in the third area may be narrower than a width of the connection line disposed in the first area and the second area.

A display panel according to another example embodiment of the present disclosure is divided into a first area, a third area disposed outside the first area, and a second area disposed outside the third area, and the display panel includes a lower stretched substrate; rigid patterns disposed on the lower stretched substrate and including a plurality of plate patterns and a plurality of line patterns; a plurality of pixels disposed on each of the plurality of plate patterns; a plurality of connection lines disposed on each of the plurality of line patterns; and an upper stretched substrate covering the plurality of pixels and the plurality of connection lines, wherein a plurality of pixels and a plurality of connection lines are disposed in the first area and the second area, wherein in the third area, only a plurality of connection lines are disposed, so that a three-dimensional display can be realized.

The third area may be inclined with respect to the second area.

A distance between the plurality of pixels disposed in the second area may be shorter than a distance between the plurality of pixels disposed in the first area.

An auxiliary plate pattern may be further disposed outside the plurality of plate patterns disposed in the first area.

The plurality of connection lines may be disposed on the auxiliary plate pattern, wherein each of the plurality of connection lines may be fixed to a metal pattern disposed on a layer different from the plurality of connection lines through an anchor hole.

A thickness of a rigid pattern disposed in the third area may be thinner than a thickness of a rigid pattern disposed in the first area and the second area.

A thickness of the upper stretched substrate disposed in the third area may be thinner than a thickness of the upper stretched substrate disposed in the first area and the second area.

A thickness of the lower stretched substrate disposed in the third area may be thinner than a thickness of the lower stretched substrate disposed in the first area and the second area.

A stretching rate of the connection line disposed in the third area may be higher than a stretching rate of the connection line disposed in the first area and the second area.

Although the example embodiments of the present disclosure have been described in detail with reference to the accompanying drawings, the present disclosure is not limited thereto and may be embodied in many different forms without departing from the technical concept of the present disclosure. Therefore, the example embodiments of the present disclosure are provided for illustrative purposes only but not intended to limit the technical concept of the present disclosure. The scope of the technical concept of the present disclosure is not limited thereto. Therefore, it should be understood that the above-described example embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
a stretchable display panel; and
an actuator configured to deform the display panel,
wherein the display panel includes a first area that is protruded by the actuator, a second area that is not protruded by the actuator, and a third area that is between the first area and the second area,
wherein a plurality of pixels and connection lines are disposed in the first area and the second area,
wherein in the third area, a plurality of connection lines connecting the plurality of pixels disposed in the first area and the plurality of pixels disposed in the second area are disposed, and the plurality of pixels are not disposed, and
wherein the third area is inclined with respect to the second area.

2. The display device of claim 1,
wherein in the third area of the display panel,
a stretchable lower substrate;
a plurality of line patterns disposed on the lower substrate;
the plurality of connection lines disposed on each of the plurality of line patterns; and
an upper substrate covering the plurality of connection lines are disposed.

3. The display device of claim 2, wherein the plurality of connection lines disposed in the third area include a 1-3 connection line extended in a first direction and a 2-3 connection line extended in a second direction.

4. The display device of claim 3, wherein the 1-3 connection line and the 2-3 connection line are formed of different metal layers.

5. The display device of claim 4, wherein an insulating pattern configured to insulate the 1-3 connection line and the 2-3 connection line is disposed in a cross area of the 1-3 connection line and the 2-3 connection line.

6. The display device of claim 1, wherein the plurality of pixels disposed in the second area are denser than the plurality of pixels disposed in the first area.

7. The display device of claim 1, wherein a length of each of the plurality of connection lines disposed in the second area is shorter than a length of each of the plurality of connection lines disposed in the first area.

8. The display device of claim 1, wherein an auxiliary plate pattern is further disposed outside a plurality of plate patterns disposed in the first area
wherein a plurality of connection lines are disposed on the auxiliary plate pattern,
wherein each of the plurality of connection lines is in contact with a metal pattern disposed on a layer different from the plurality of connection lines through an anchor hole.

9. The display device of claim 2,
wherein in each of the first area and the second area of the display panel,
a stretchable lower substrate;
a pattern layer disposed on the lower substrate and including a plurality of plate patterns and a plurality of line patterns;
a plurality of pixels disposed on each of the plurality of plate patterns;
a plurality of connection lines disposed on each of the plurality of line patterns; and
an upper substrate covering the plurality of pixels and the plurality of connection lines are disposed.

10. The display device of claim 9,
wherein the plurality of connection lines disposed in the first area include a 1-1 connection line extended in a first direction and a 2-1 connection line extended in a second direction,
wherein the 1-1 connection line and the 2-1 connection line are disposed on the same layer.

11. The display device of claim 9,
wherein the plurality of connection lines disposed in the second area include a 1-2 connection line extended in a first direction and a 2-2 connection line extended in a second direction,
wherein the 1-2 connection line and the 2-2 connection line are disposed on the same layer.

12. The display device of claim 9, wherein a thickness of the pattern layer disposed in the third area is thinner than a thickness of the pattern layer disposed in the first area and the second area.

13. The display device of claim 9, wherein a thickness of the upper substrate disposed in the third area is thinner than a thickness of the upper substrate disposed in the first area and the second area.

14. The display device of claim 9, wherein a thickness of the lower substrate disposed in the third area is thinner than a thickness of the lower substrate disposed in the first area and the second area.

15. The display device of claim 9, wherein a radius of curvature of the connection line disposed in the third area is shorter than a radius of curvature of the connection line disposed in the first area and the second area.

16. The display device of claim 9, wherein an amplitude of the connection line disposed in the third area is greater than an amplitude of the connection line disposed in the first area and the second area.

17. The display device of claim 9, wherein a width of the connection line disposed in the third area is narrower than a width of the connection line disposed in the first area and the second area.

18. A display panel divided into a first area, a third area disposed outside the first area, and a second area disposed outside the third area, the display panel comprising:
a lower stretched substrate;
a plurality of plate patterns and a plurality of line patterns disposed on the lower stretched substrate;
a plurality of pixels disposed on each of the plurality of plate patterns;
a plurality of connection lines disposed on each of the plurality of line patterns; and
an upper stretched substrate covering the plurality of pixels and the plurality of connection lines,
wherein a plurality of pixels and a plurality of connection lines are disposed in the first area and the second area,
wherein in the third area, the plurality of pixels are not disposed and only a plurality of connection lines are disposed.

19. The display panel of claim 18, wherein a distance between the plurality of pixels disposed in the second area is shorter than a distance between the plurality of pixels disposed in the first area.

20. The display panel of claim 18, wherein an auxiliary plate pattern is further disposed outside the plurality of plate patterns disposed in the first area.

21. The display panel of claim 20,
wherein the plurality of connection lines are disposed on the auxiliary plate pattern,
wherein each of the plurality of connection lines is fixed to a metal pattern disposed on a layer different from the plurality of connection lines through an anchor hole.

22. The display panel of claim 18, wherein a thickness of a rigid pattern disposed in the third area is thinner than a thickness of a rigid pattern disposed in the first area and the second area.

23. The display panel of claim 18, wherein a thickness of the upper stretched substrate disposed in the third area is thinner than a thickness of the upper stretched substrate disposed in the first area and the second area.

24. The display panel of claim 18, wherein a thickness of the lower stretched substrate disposed in the third area is thinner than a thickness of the lower stretched substrate disposed in the first area and the second area.

25. The display panel of claim 18, wherein a stretching rate of the connection line disposed in the third area is higher than a stretching rate of the connection line disposed in the first area and the second area.

26. A display device, comprising:
a stretchable display panel having a first surface and an opposite second surface; and
an actuator adjacent to the stretchable display panel, the actuator having a first surface that faces the second surface of the stretchable display panel, the actuator, in operation, changing a shape of the display panel,
wherein the display panel includes a first area that is changed in shape by the actuator, a second area that is not changed in shape by the actuator, and a third area that is between the first area and the second area,
wherein the second surface of the display panel in the third area is spaced apart from the first surface of the actuator in the third area,
wherein the first surface of the display panel in the first area is changed in shape by the actuator according to a shape of the first surface of the actuator in the first area,
wherein the stretchable display panel includes a plurality of pixels and a plurality of connection lines,
wherein adjacent pixels of the plurality of pixels are coupled to each other by at least one connection line of the plurality of connection lines,
wherein the first area has a first density of the plurality of pixels,
wherein the second area has a second density of the plurality of pixels,
wherein the third area has a third density of the plurality of pixels, and
wherein the third density is smaller than the first density and the second density.

27. The display device of claim 26, wherein in the first density and the second density are the same as each other.

28. The display device of claim 26, wherein in the first density is smaller than the second density.

29. The display device of claim 26, wherein the third density is zero and therefore the third area does not include any pixels among the plurality of pixels.

30. The display device of claim 26, comprising an auxiliary plate pattern disposed adjacent to the plurality of pixels of the first area, the auxiliary plate pattern not overlapping the second area.

31. The display device of claim 26, wherein a first connection line among the plurality of connection lines includes a first portion having a first curvature, the first connection line having a first width in a first direction and a first amplitude in the first direction, the first connection line disposed in the first area and the second area.

32. The display device of claim 31, wherein a second connection line among the plurality of connection lines includes a second portion having the first curvature, the second connection line having a second width in the first direction and a second amplitude in the first direction, the second connection line disposed in the third area,
wherein the second amplitude and the first amplitude are the same as each other, and
wherein the second width is smaller than the first width.

33. The display device of claim 31, wherein a second connection line among the plurality of connection lines includes a second portion having a second curvature, the second connection line having a second width in the first direction and a second amplitude in the first direction, the second connection line disposed in the third area,
wherein the second amplitude and the first amplitude are the same as each other, and
wherein the second width and the first width are the same as each other.

34. The display device of claim 31, wherein a second connection line among the plurality of connection lines includes a second portion having the first curvature, the second connection line having a second width in the first direction and a second amplitude in the first direction, the second connection line disposed in the third area,
wherein the second amplitude is greater than the first amplitude, and
wherein the second width and the first width are the same as each other.

* * * * *